United States Patent
Diaz-Garcia et al.

[11] Patent Number: 5,881,083
[45] Date of Patent: Mar. 9, 1999

[54] CONJUGATED POLYMERS AS MATERIALS FOR SOLID STATE LASER

[75] Inventors: Maria Diaz-Garcia, Goleta; Benjamin Schwartz, Encino; Fumitomo Hide; Alan J. Heeger, both of Santa Barbara, all of Calif.

[73] Assignee: The Regents of the University of California, Oakland, Calif.

[21] Appl. No.: 887,676

[22] Filed: Jul. 3, 1997

[51] Int. Cl.$^6$ ............................. H01S 3/14; H01S 3/20
[52] U.S. Cl. ............................. 372/39; 372/53; 372/54
[58] Field of Search ............................. 372/39, 53, 54, 372/3, 98, 32, 20, 25; 385/143; 528/179, 15, 28

[56] References Cited

U.S. PATENT DOCUMENTS

| | | | |
|---|---|---|---|
| 5,222,092 | 6/1993 | Hench et al. | 372/53 |
| 5,563,182 | 10/1996 | Epstein et al. | 522/146 |
| 5,597,890 | 1/1997 | Jenekhe | 528/397 |
| 5,605,726 | 2/1997 | Gibbons et al. | 528/15 |
| 5,701,323 | 12/1997 | Kahr et al. | 372/54 |

Primary Examiner—Hemang Sanghavi
Attorney, Agent, or Firm—Burns, Doane, Swecker & Mathis, L.L.P.

[57] ABSTRACT

Solid state lasers based upon conjugated polymers are disclosed. A conjugated polymer useful in the practice of this invention is a conjugated polymer which has a ground state and an excited state and which, in the form of a nondiluted thin film, meets the criteria of;

i. having a strong absorption in the ground state with an absorption coefficient of at least about $10^4$ cm$^{-1}$ and an absorption depth not greater than about 1 $\mu$m, ii. having an efficient luminescence emission from the excited state; this emission being shifted to lower energy relative to the ground state absorption, and iii. providing stimulated emission which is not overwhelmed by photoinduced absorption, such that the thin film exhibits gain narrowing and amplified spontaneous emission. These conjugated polymers have gain lengths in the micron or even sub-micron regime and therefore exhibit laser action with low pumping threshold as thin solid films with thicknesses in the micron or even sub-micron regime.

28 Claims, 9 Drawing Sheets

CONJUGATED POLYMERS AS MATERIALS FOR SOLID STATE LASER

REFERENCE TO GOVERNMENT SUPPORT

This invention was made in part with Government support under contract N-00014-91-J-1235 awarded by the Office of Naval Research. The Government has certain rights in this invention.

FIELD OF THE INVENTION

This invention relates to solid state lasers and, more particularly, to the use of conjugated polymers as active materials for solid state lasers.

BACKGROUND OF THE INVENTION

Solid state photonic devices are a class of devices in which the quantum of light, the photon, plays a role. They function by utilizing the electro-optical and/or opto-electronic effects in solid state materials. Because the interband optical transition (in absorption and/or in emission) is involved in photonic phenomena and because photon energies from near infrared (IR) to near ultraviolet (UV) are of interest, the relevant materials are semiconductors with band gaps in the range from 1 to 3 eV. Typical inorganic semi-conductors used for photonic devices are Si, Ge, GaAs, GaP, GaN and SiC etc. Photonic devices are often classified into three categories: light sources (light emitting diodes, lasers, diode lasers etc.), photodetectors (photoconductors, photo-diodes etc.) and energy conversion devices (photovoltaic cells) [S. M. Sze, Physics of Semiconductor Devices (Wiley, New York, 1981)]. All three are important. Because photonic devices are utilized in a wide range of applications, they continue to provide a focus for research laboratories all over the world.

Conjugated polymers are a novel class of semiconductors which combine the optical and electronic properties of semiconductors with the processing advantages and mechanical properties of polymers. Semiconducting polymers typically have band gaps in the range from 1 to 3 eV. The molecular structures of a few important examples of semiconducting polymers are shown in FIG. 1. Because of the $sp^2P_z$ bonding of these planar conjugated macromolecules, each carbon is covalently bonded to three nearest neighbors (two carbons and a hydrogen); and there is formally one unpaired electron per carbon. Thus, the electronic structure (semiconductor or metal) depends on the number of atoms per repeat unit. For example the repeat unit of poly(paraphenylene vinylene), PPV, contains eight carbons; PPV is a semiconductor in which the fundamental $p_z$-band is split into eight sub-bands. The energy gap of the semiconductor, the $\pi$-$\pi$* gap, is the energy between the highest occupied molecular orbital and the lowest unoccupied molecular orbital.

When functionalized with flexible side chains [for example, poly(2-methoxy-5-(2'-ethyl-hexyloxy)-1,4-phenylene vinylene), MEH-PPV; see FIG. 1], conjugated polymer materials become soluble in common organic solvents and can be processed from solution at room temperature into uniform, large area, optical quality thin films [D. Braun and A. J. Heeger, Appl. Phys. Lett. 58, 1982 (1991)]. Because of the large elongation to break which is a characteristic feature of polymers, such films are flexible and easily fabricated into desired shapes that are useful in novel devices [G. Gustafsson, Y. Cao, G. M. Treacy, F. Klavetter, N. Colaneri, and A. J. Heeger, Nature 357, 477 (1992).]

The goal of using such semiconducting polymers in "plastic" photonic devices is rapidly becoming reality. High performance photonic devices fabricated from conjugated polymers have been demonstrated, including light-emitting diodes [J. H. Burroughes, D. D. C. Bradley, A. R. Brown, R. N. Marks, K. Mackay, R. H. Friend, P. L. Burns and A. B. Holmes, Nature 347, 539 (1990);D. Braun and A. J. Heeger, Appl. Phys. Lett. 58, 1982 (1991)], light-emitting electro-chemical cells [Q. Pei, G. Yu, C. Zhang, Y. Yang, and A. J. Heeger, Science 269, 1086–1088 (1995)], polymer grid triodes (a new architecture for plastic transistors) [Y. Yang and A. J. Heeger, Nature 372, 344 (1994)], polymer field-effect transistors [F. Garnier, R. Hajlaoui, A. Yassar, P. Srivastava, Science 265 1684 (1994);A. Dodabalapur, L. Torsi and H. E. Katz, Science 268, 270 (1995)], photovoltaic cells, and photodetectors [G. Yu, J. Gao, J. C. Hummelen, F. Wudl and A. J. Heeger, Science 270, 1789 (1995)], and optocouplers [G. Yu, K. Pakbaz, C. Zhang and A. J. Heeger, J. Electron. Materials 23, 925 (1994).]; i.e. nearly all the categories which characterize the field of photonic devices. In many cases, such polymer-based devices have reached performance levels comparable to or even better than their inorganic counterparts.

Notably missing from this list, however, is the category representing solid state lasers fabricated from semiconducting polymers. The achievement of spectrally narrow solid state polymer lasers, either optically pumped or pumped by carrier injection, (i.e. laser diodes) is an important goal for polymer optoelectronic devices.

Laser emission has been observed from MEH-PPV in dilute solution in an appropriate solvent, in direct analogy with a conventional dye lasers [D. Moses, Appl. Phys. Lett. 60, 3215 (1992); U.S. Pat. No. 5,237,582]. In this application, the diluted and dissolved luminescent polymer serves as the laser dye.

Solid state lasers require pumping a photoluminescent, solid material with suitable gain, said material contained within a resonant structure. The pumping can be done either optically (optically pumped lasers) or through carrier injection (carrier injection lasers). The photoluminescent material has gain if the stimulated emission is strong enough to exceed any losses from, for example, absorption from the ground state to an excited state, photoinduced absorption, or scattering. If the luminescent medium exhibits gain, Light Amplification by Stimulated Emission of Radiation (LASER) can be achieved if the optical path length in the medium exceeds the gain length. (The gain length, $L_g$, of a laser material is defined as the distance required for the amplitude to increase by $e^{+1}$.)

Many conjugated polymers exhibit relatively high photoluminescence (PL) efficiencies with emission that is shifted sufficiently far from the absorption edge that self-absorption is minimal. In such a case, stimulated emission, essential to the development of lasers, might be expected throughout the lifetime of the excited state. Ultrafast spectroscopic studies of poly(phenylenevinylenes) (PPVs) have revealed that stimulated emission is readily observed in solutions and dilute blend films [M. Yan, L. J. Rothberg, E. W. Kwock and T. M. Miller, Phys. Rev. Lett. 75, 1992 (1995)J. M. Leng et al., Phys. Rev. Lett. 72, 156 (1994); J. W. Blatchford, Phys. Rev. Lett. 76, 1513 (1996); M. Yan, L. J. Rothberg, B. R. Hsieh and R. R. Alfano, Phys. Rev. B 49, 9419 (1994); M. Yan, Phys. Rev. Lett. 72, 1104 (1994); R. Kersting, Phys. Rev. Lett. 70, 3820 (1993); and poly (paraphenylenes) (PPPs) [W. Graupner, Phys. Rev. Lett. 76, 847 (1996); W. Graupner et al., Chem. Phys. Lett. 246, 95 (1995); T. Pauck et al., Chem. Phys. Lett. 244, 171 (1995)].

In neat solid films, however, stimulated emission typically either has not been observed or has been observed to decay within at most a few picoseconds. This absence of stimulated emission results from strong photoinduced absorption (PA) which overwhelms the stimulated emission in neat films but not when the polymer chains are isolated in solution or in dilute blends. The absence of observable stimulated emission implies that the excited medium does not exhibit gain. Without gain, polymer solid state lasers are not possible. On the other hand, since self-absorption of the luminescence by transitions from the ground state is not important, we have postulated that semiconducting luminescent polymers with gain can be achieved if photoinduced absorption which overlaps the emission spectrum is eliminated.

For semiconducting luminescent polymers the pump transition and the emission derive from the same electronic transition [A. J. Heeger, S. Kivelson, J. R. Schrieffer, and W.-P. Su, Rev. Mod. Phys. 60, 781 (1988)]. The spectral Stokes shift arises from a combination of structural relaxation and disorder. In this case, general radiation theory indicates that the transition probability for absorption will be approximately equal to the transition probability for stimulated emission [A. Yariv, Quantum Electronics, 3rd edn, (Wiley, New York, 1989)]. Therefore, $L_g \approx L_\alpha$/[fractional population in excited state] where $L_\alpha \approx 0.1–1$ $\mu$m or even less. Thus, under conditions of population inversion when the fractional population of the excited state approaches unity, the gain length in semiconducting polymers is in the micron or even sub-micron regime.

Materials with gain lengths in the micron and sub-micron regime are rare and very special; such high gain materials are the enabling feature of thin film solid state lasers, either optically pumped or pumped via carrier injection.

In semiconducting, luminescent polymers, the emission is at longer wavelengths than the onset of significant absorption (the Stokes shift). Because of the spectral Stokes shift between the absorption and the emission, there is minimal self-absorption of the emitted radiation [H. Burroughes, D. D. C. Bradley, A. R. Brown, R. N. Marks, K. Mackay, R. H. Friend, P. L. Bums and A. B. Holmes, Nature 347, 539 (1990); D. Braun and A. J. Heeger, Appl. Phys. Lett. 58 1982 (1991)]. Thus, in semiconducting luminescent polymers, self-absorption need not make the materials lossy. Moreover, since the absorption and emission are spectrally separated, pumping the excited state via the $\pi$ to $\pi^*$ transition does not stimulate emission. Thus, by pumping the $\pi$-$\pi^*$ transition, one can achieve an inverted population.

Because of the large joint density of states associated with the direct $\pi$ to $\pi^*$ (interband) transition of these quasi-one-dimensional, semiconducting polymers, the absorption coefficient ($\alpha$) is large, typically $\alpha = 10^5$ cm$^{-1}$ or greater [A. J. Heeger, S. Kivelson, J. R. Schrieffer, and W.-P. Su, Rev. Mod. Phys. 60, 781 (1988)].

Gain narrowing and amplified spontaneous emission (as needed for laser emission) in neat solid films of semiconducting luminescent polymers, neither diluted nor blended, has not been previously demonstrated. More specifically, gain narrowing and amplified spontaneous emission in thin solid films of semiconducting luminescent polymers, neither diluted nor blended, with thickness less than 10 $\mu$m have not been previously observed.

SUMMARY OF THE INVENTION

In this invention, we overcome the limitations of the prior art and demonstrate that a sub-class of semiconducting luminescent conjugated polymers possess unique properties as laser materials. These conjugated polymers have gain lengths in the micron or even sub-micron regime and therefore exhibit laser action with low pumping threshold as thin solid films with thicknesses in the micron or even sub-micron regime.

In one aspect this invention takes the form of a solid state lasing layer made up of conjugated polymer. A conjugated polymer useful in the practice of this invention is a conjugated polymer which has a ground state and an excited state and which, in the form of a nondiluted thin film, meets the criteria of;

i. having a strong absorption in the ground state with an absorption coefficient of at least about $10^4$ cm$^{-1}$ and an absorption depth not greater than about 1 $\mu$m), ii. having an efficient luminescence emission from the excited state; this emission being shifted to lower energy relative to the ground state absorption, and iii. providing stimulated emission which is not overwhelmed by photoinduced absorption, such that the thin film exhibits gain narrowing and amplified spontaneous emission.

Without intending to limit the scope of the polymers employed in the present invention as described by these criteria, typically the conjugated polymers which meet these criteria are functionalized conjugated polymers. A "functionalized conjugated polymer" is a polymer having repeat units making up a conjugated backbone and, in addition, nonconjugated moieties covalently bonded to the backbone and extending out from the backbone. These nonconjugated moieties should be at least about 5 atoms long. Preferably these nonconjugated moieties provide at least about 5 carbon and/or oxygen atoms for each conjugated repeat unit in the backbone. These nonconjugated moieties may extend from copolymeric units in the polymer which are separate from the conjugated units but more commonly are attached to the conjugated repeat units as substituents. In both cases, but especially in the case of nonconjugated moieties extending from separate copolymeric units, the nonconjugated moiety should not appreciably disrupt the overall conjugated nature of the conjugated polymer.

Also without intent to limit the scope of this invention or to be bound to any particular theory of action, we believe that the reason that semiconducting conjugated polymers examined heretofore have failed to provide workable solid state lasers is because the close proximity of the polymer chains resulted in overlapping photoinduced absorption from interchain $\pi$-electron interactions. We believe that, much as in the case of laser action exhibited by semiconducting polymers either in dilute solution or when diluted in blends with a suitable host polymer, laser action is achieved with the functionalized conjugated polymers because the functionalizing groups eliminate or reduce interchain $\pi$-electron interactions. We believe that by functionalizing the conjugated polymer chain overlapping photoinduced absorption is reduced and efficient stimulated emission can be obtained from conjugated polymers.

In another aspect, this invention employs these functionalized conjugated polymer-based lasing layers in the form of a thin film having a thickness of less than 10 microns, or even 5 microns or even 1 micron.

These functionalized conjugated polymer-based lasing layers are high efficiency materials. They can exhibit gain narrowing and amplified spontaneous emission at pump energies per pulse of less than 100 micro-Joules ($\mu$J), and in some cases of less than 1 $\mu$J.

In yet an additional aspect this invention provides lasers employing these functionalized conjugated polymer-based solid state lasing layers. In these devices the layers exhibit gain narrowing and amplified spontaneous emission. These lasers can take the forms of, for example, a thin film laser, an optically pumped laser or an injection laser. These lasers may include features or aspects known to enable or enhance their performance. Examples of these features or aspects are employing mirrors external to the lasing layer to provide feedback to the lasing layer; presenting the solid state lasing layer is in the form of an optical waveguide; presenting the solid state lasing layer is in the form of an optical waveguide in combination a substrate which is patterned to provide feedback through distributed feedback; positioning at least one dielectric layer adjacent to the lasing layer and providing gain path extension in the lasing layer through mismatch reflection and waveguiding; and employing a microcavity within which the lasing layer is located.

In additional aspects, these lasers can take the form of a polymer light-emitting diode or a polymer light-emitting electrochemical cell.

DETAILED DESCRIPTION OF THE INVENTION

Brief Description of the Drawings

This invention will be further described with reference to the accompanying drawings in which.

DESCRIPTION OF PREFERRED EMBODIMENTS

The Conjugated Polymers

Figure 1:
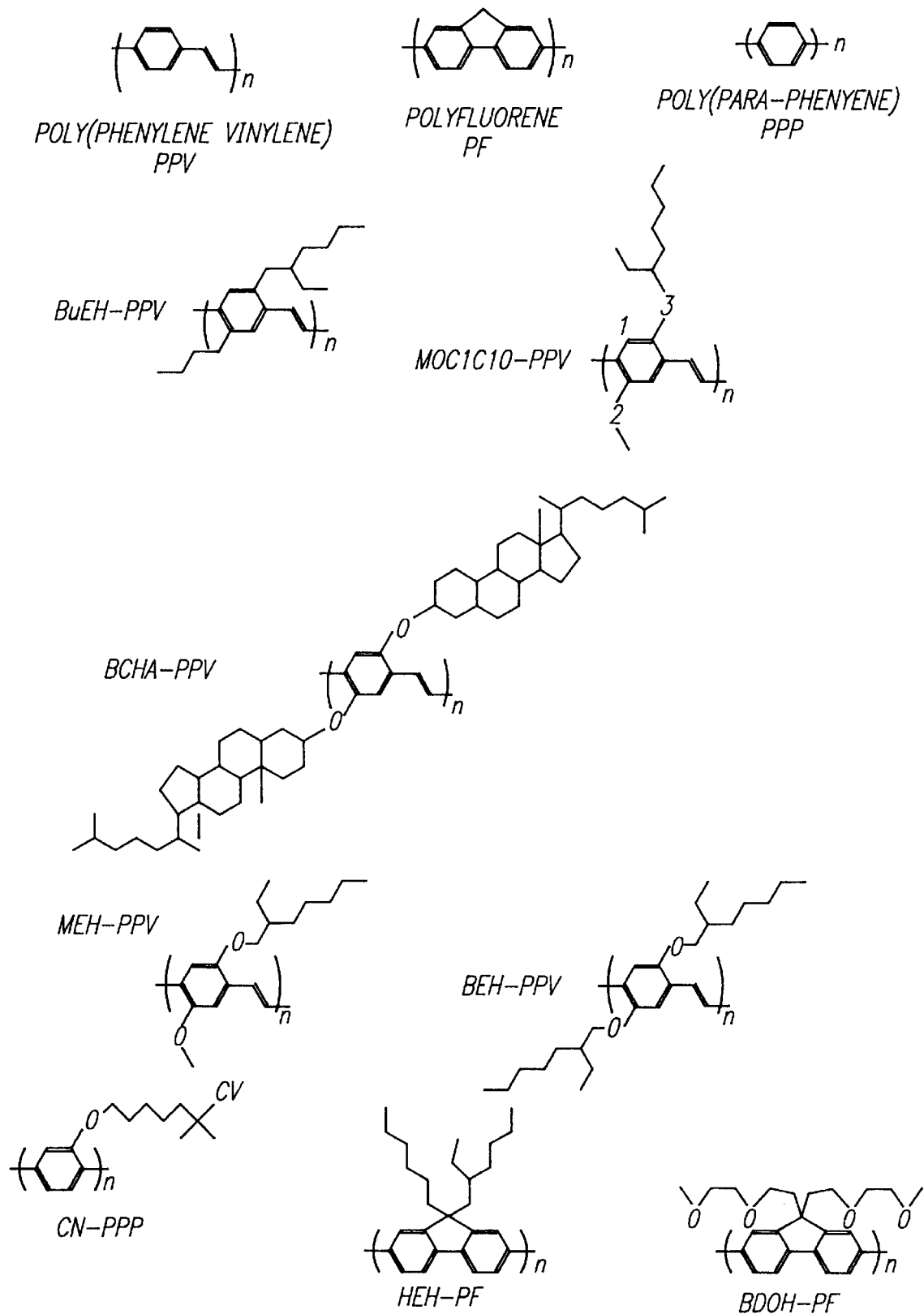
FIG. 1 provides the molecular structure of a few examples of semiconducting luminescent polymers including representative functionalized conjugated polymers.

The present invention employs solid bodies of functionalized conjugated polymers as active lasing layers.

Derivatives of conjugated polymers with bulky side chains (such as MEH-PPV, BCHA-PPV and the like) were used heretofore to obtain solubility in common organic solvents. We have now found that when such bulky side chain substituents are present in conjunction with the conjugated backbone within the polymer in our functionalized conjugated polymers, the absorption coefficient is reduced to values between $10^4 cm^{-1}$ and $10^5 cm^{-1}$. Thus, the optical absorption depth, $L_\alpha = \alpha^{-1}$, is typically less than 1000 nm (that is, less than 1 µm) or even less than 0.1 µm.

We have found that to achieve laser emission from a luminescent conjugated polymer material with micron or even sub-micron gain length, that material needs to satisfy the following criteria:

1. Strong absorption in the ground state with absorption coefficient of $10^4$ cm$^{-1}$ to $10^5$ cm$^{-1}$ or greater (absorption depth≦1µm) to enable pumping of the excited state and the achievement of an inverted population.

2. Emission with relatively high quantum efficiency (greater than about 10% photon out per photon in) from the excited state; said emission being shifted to lower energy relative to the ground state absorption (to minimize self-absorption and to enable the achievement of a population inversion) as neat, nondiluted solid films.

3. Stimulated emission not overwhelmed by photoinduced absorption as neat, nondiluted solid films; so that when pumped to the excited state, the material can exhibit gain as required to achieve laser action.

When 1 and 2 are satisfied, a population inversion can be achieved. With 3, stimulated emission can lead to amplification and gain narrowing with a gain length in the micron or even sub-micron regime.

This invention employs a sub-class of semiconducting, luminescent conjugated polymers as materials for use in solid state lasers. By using materials within this sub-class, solid films can be fabricated in which stimulated emission is sufficiently strong relative to competing processes that the materials exhibit gain with a gain length less than 10 micrometers (10 µm) or even less than 1 micrometer (1 µm). Laser action with low threshold is observed for films with thickness below 10 micrometers (10 µm) or even less than 1 micrometer (1 µm). Criteria are established for achieving thin solid films of semiconducting polymers in which the gain lengths are less than 10 micrometers (10 μm) or even less than 1 micrometer (1 μm), and for achieving lasing from thin solid films of semiconducting polymers in which the gain lengths are below 10 micrometers (10 μm) or even less than 1 micrometer (1 μm).

As previously described, the conjugated polymers which are employed in this invention can be defined by their ability to satisfy three criteria:

Criterion 1 is satisfied by all known conjugated polymers.

Criterion 2 is defined by the photoluminescence (PL) and includes, for example, the poly(phenylene) and substituted derivatives, poly(phenylenevinylene) and substituted derivatives, polyfluorene and substituted derivatives, poly (p-pyridine) and substituted derivatives, and poly(p-pyridal vinylene) and substituted derivatives. Some other conjugated polymers do not exhibit significant PL, for example, poly(acetylene) in either the cis- or trans isomeric forms. Still other conjugated polymers exhibit only relatively weak PL as neat, nondiluted solid films, including for example polythiophene and its substituted derivatives. Preferred materials are those with PL quantum efficiencies greater than 10%, more preferred are those with PL quantum efficiencies greater than 20%, still more preferred are those with PL quantum efficiencies greater than 30%, even more preferred are those with PL quantum efficiencies greater than 40%, and yet more preferred are those with PL quantum efficiencies greater than 50%. The experimental methods for PL measurement are well known and long established in the prior art.

Criterion 3 defines the specific sub-class of conjugated polymers which are materials for use as solid state lasers. Materials which satisfy criteria 3 are identified by exhibiting laser action (lasing); that is, by exhibiting gain narrowing.

Figure 2:
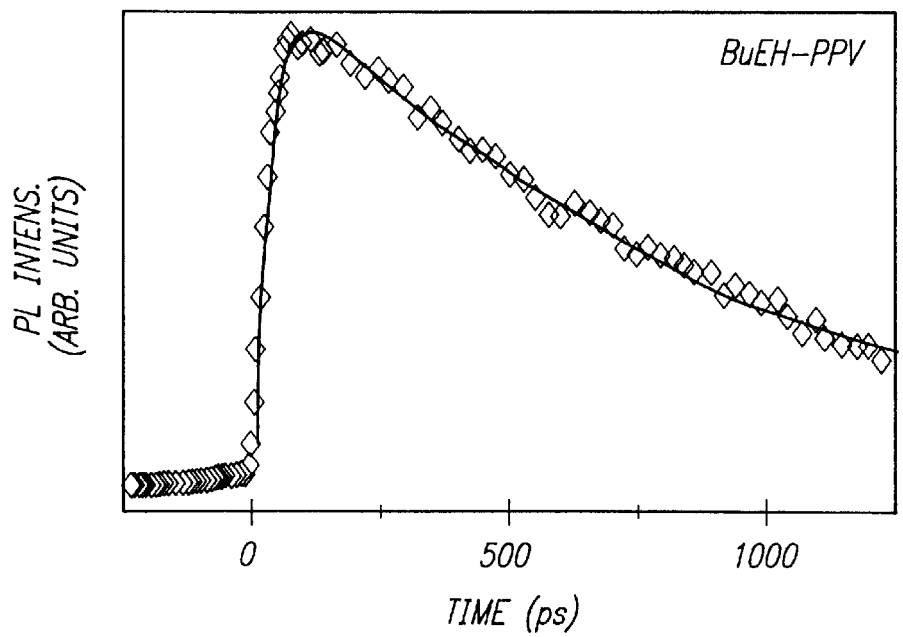
FIG. 2 is a graph of the PL decay of a functionalized conjugated polymer, a soluble derivative of PPV, BuEH-PPV.

Gain narrowing experiments can be and usually are performed with the PL material at room temperature. Although less convenient, measurements on materials at low temperature are also possible. For such measurements it is convenient to use the frequency doubled output (532 nm) of a 10 Hz, Q-switched Nd:YAG laser (for example the Spectra Physics Quanta-Ray DCR-3) which serves as the excitation source. A variety of other pump sources can be used. The pump source laser must emit pulses of sufficient energy to exceed the threshold for laser action. As shown in the Examples, the required energy per pulse ranges from less than 0.1 μJ per pulse to greater than 10 mJ per pulse. Although the use of 10 ns pulses is not critical, the pump pulse width should be greater than the luminescence decay time. For luminescent conjugated polymers which satisfy criteria 2, the PL decay time is typically several hundred picoseconds to one thousand picosecond (one thousand picoseconds equals 1 ns). The PL decay of a soluble derivative of PPV, BuEH-PPV, is shown in FIG. 2.

Figure 3:
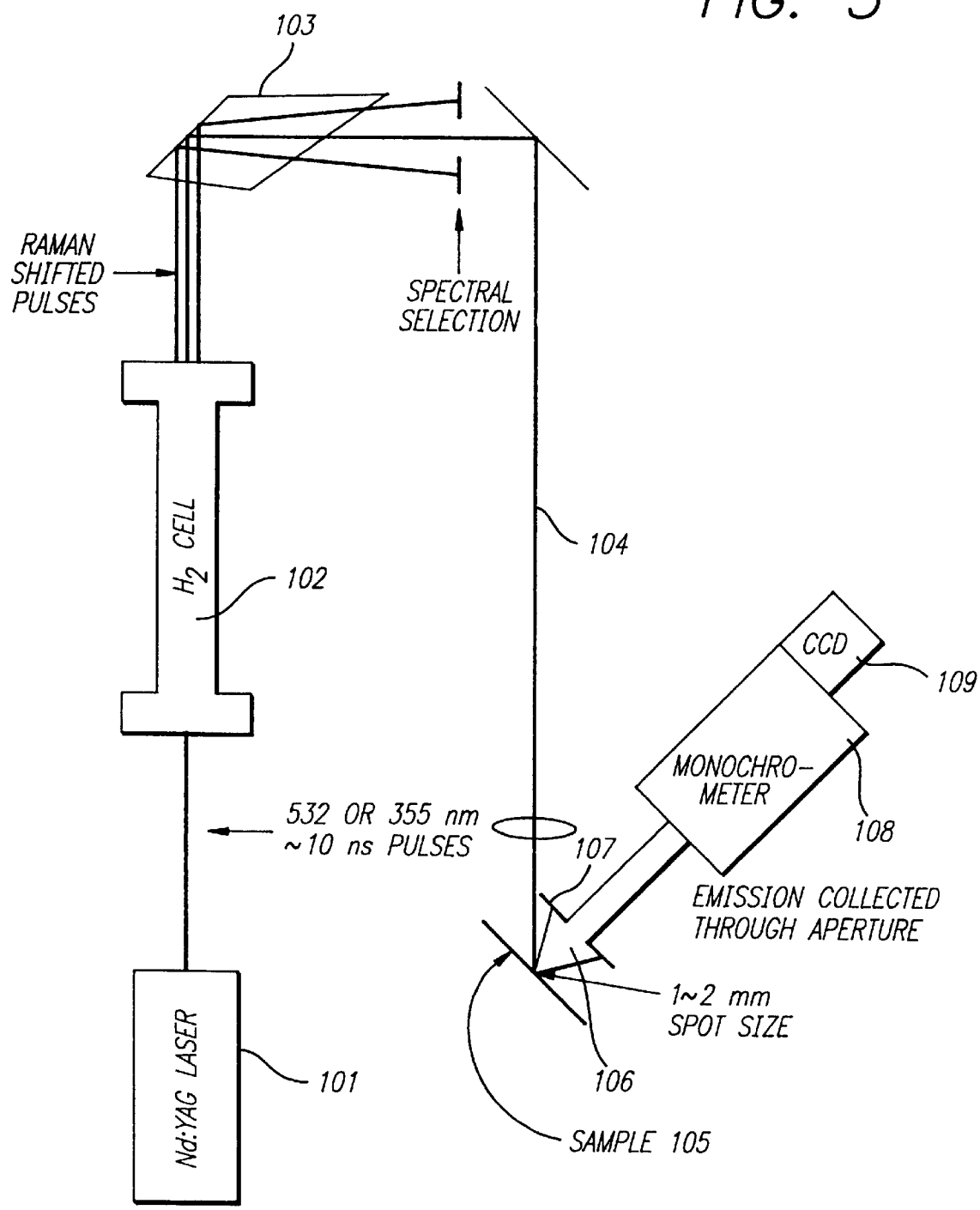
FIG. 3 is a schematic diagram of an apparatus capable of testing a layer of polymer for gain narrowing.

To test for gain narrowing a test set up as depicted in FIG. 3 can be used. In FIG. 3, 101 is a neodymium-YAG laser capable of emitting specific length pulses at 355 or 532 nm. These pulses are passed through a hydrogen cell 102 to yield Raman-shifted pulses which are separated into various spectral lines by divider 103. Ten ns pulses 104, conveniently focused to a spot size of ~1.5 mm, are incident on the sample 105 at near normal incidence, for example ≦30° angle from the normal to the film surface. The emission 106 that passes through a ~2 mm aperture 107 placed normal to the front face of the sample is collected, frequency dispersed by a single monochromator 108, and detected by, for example, a CCD array 109.

Figure 4:
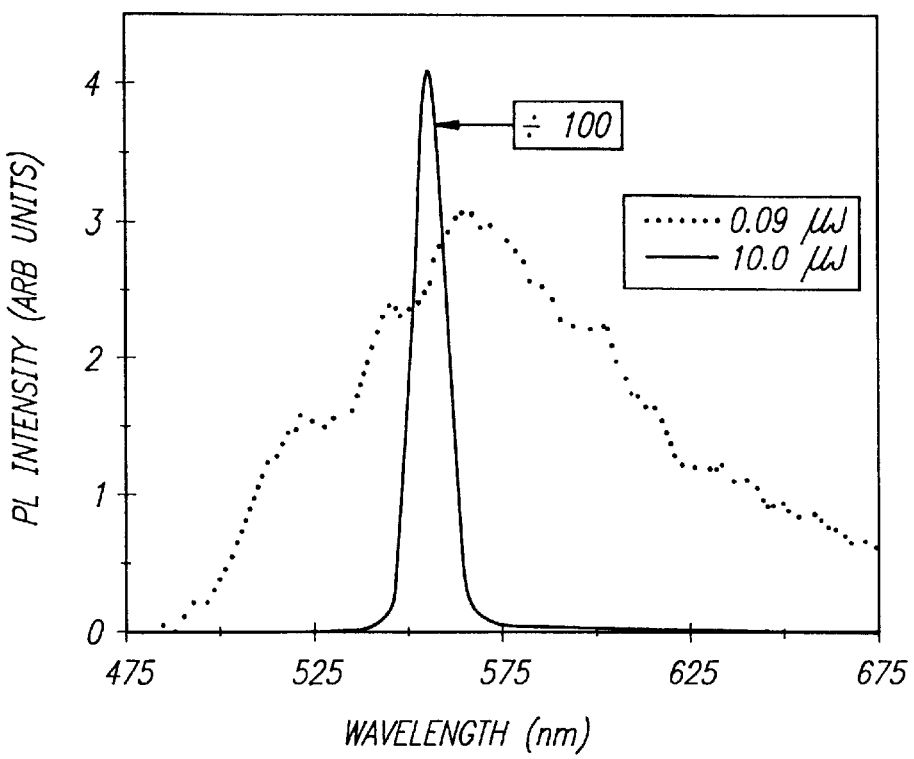
FIG. 4 is an emission spectrum of BuEH-PPV; the solid curve is the PL spectrum as emitted at low pump energies (for example, at 0.09 µJ per pulse); the dashed curve is the gain narrowed emission spectrum obtained at higher pump energy (for example at 10 µJ per pulse).
Figure 5:
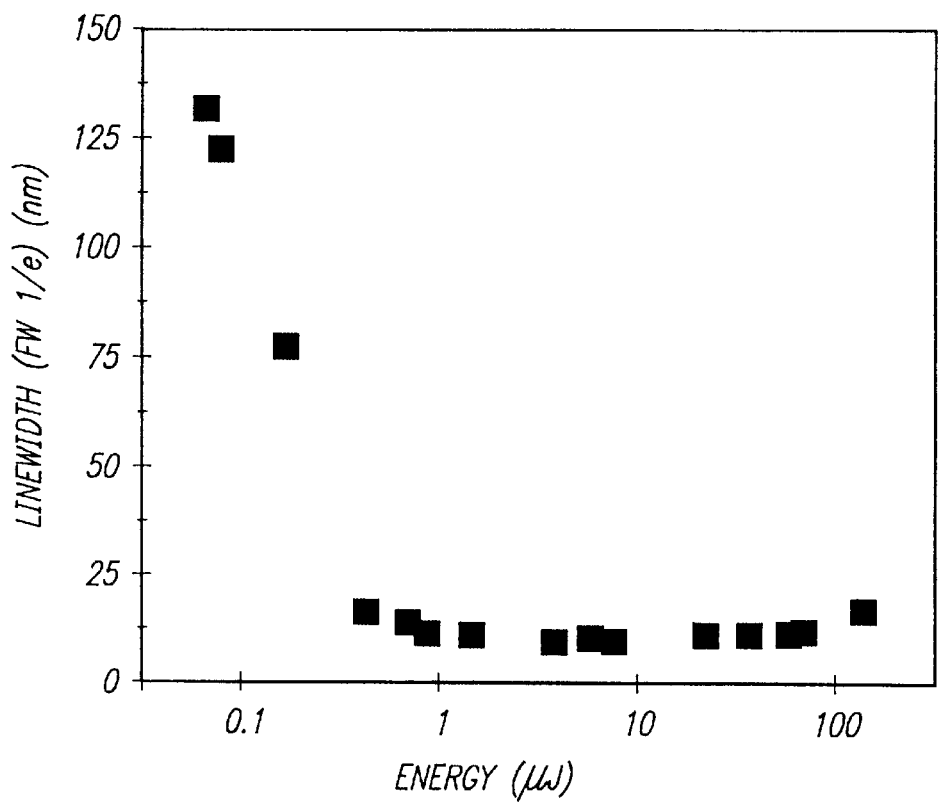
FIG. 5 is a graph showing the gain narrowing transition for BuEH-PPV; the width of the emission spectrum is plotted vs pump energy (energy per pulse).

The emission spectrum of a representative polymer, BuEH-PPV, is shown in FIG. 4. The dashed curve is the PL spectrum as emitted at low pump power. The broad luminescence with characteristic vibronic side band structure is typical of conjugated polymers which satisfy criterion 2. At higher pump powers, BuEH-PPV exhibits gain narrowing as shown in FIG. 4. The gain narrowing transition for BuEH-PPV is shown in FIG. 5. As shown in FIG. 5, the threshold for gain narrowing (that is, the pump energy required to reduce the linewidth to one-half of its un-narrowed value) is at approximately 0.2 μJ per pulse.

Functionalized conjugated polymers are representative of polymers which satisfy all three of these criteria. These functionalized conjugated polymers are polymers having repeat units making up a conjugated backbone and, in addition, at least one nonconjugated moiety extending from the polymer. The at least one nonconjugated group, taken as a whole should provide at least about 5 carbon and/or oxygen atoms of chain length for each conjugated repeat unit extending from the backbone. These nonconjugated moieties may extend from copolymeric units in the polymer which are separate from the conjugated units but more commonly are attached to the conjugated repeat units as substituents. These polymers may include, for example, functionalized poly(phenylenes), functionalized poly (phenylenevinylenes), functionalized poly(fluorene), functionalized poly(p-pyridine), and functionalized poly(p-pyridalvinylene).

The nonconjugated groups which are present in these conjugated polymers as functionalizing groups contain at least about five carbon and/or oxygen atoms per conjugated unit. We have observed good results with nonconjugated groups ranging in size from a single five atom moiety to several very large groups such as cholestanoxy groups which contain 27 carbon and oxygen atoms. Thus, it is reasonable to select from about 1 to about 4 nonconjugated groups having a molecular size totalling from about 5 to about 100, and especially from about 6 to about 80 and more particularly 8 to about 70 carbon and oxygen atoms per conjugated repeat unit in the conjugated polymer. These nonconjugated groups can include hydrocarbyls, substituted hydrocarbyls, hydrocarbyloxys and poly(oxyalkylene)s. They may be straight chain but more typically are branched.

The term "hydrocarbyl" refers to an organic radical primarily composed of carbon and hydrogen which may be aliphatic, alicyclic, aromatic or combinations thereof. It includes, without limitation "alkyls", "alkenyls", and "aryls" and "cycloalkyls".

The term "substituted hydrocarbyl" refers to a hydrocarbyl group having from 1 to 3 substituents selected from the group consisting of hydroxy, acyl, acylamino, acyloxy, alkoxy, alkenyl, alkynyl, amino, aminoacyl, aryl, aryloxy, carboxy, carboxyalkyl, cyano, cycloalkyl, guanidino, halo, heteroaryl, heterocyclic, nitro, thiol, thioaryloxy, thioheteroaryloxy, and the like. Preferred substituents include hydroxy and cyano.

The term "hydrocarbyloxy" refers to an organic radical primarily composed of carbon, oxygen and hydrogen which may be aliphatic, alicyclic, aromatic or combinations thereof. It includes, without limitation "alkoxys", "alkoxyalkyls" and "aryloxys".

The term "poly(oxyalkylene)" refers to a polyether having on average from about 2 to about 100 oxyalkylene units where the alkylene portion is most typically a 2 or 3 carbon alkylene, that is ethylene or propylene.

The term "alkoxy" refers to the group alkyl-O—. Such alkoxy groups include, by way of example, methoxy, ethoxy, n-propoxy, iso-propoxy, n-butoxy, tert-butoxy, sec-butoxy, n-pentoxy, n-hexoxy, 1,2-dimethylbutoxy, and the like.

The term "alkoxyalkyl" refers to the group -alkylene-O-alkyl which includes by way of example, methoxymethyl ($CH_3OCH_2$—), methoxyethyl ($CH_3$—O—$CH_2CH_2$—) and the like.

The term "alkenyl" refers to alkenyl groups preferably having from 2 to 8 carbon atoms and more preferably 2 to 6 carbon atoms and having at least 1 and preferably from 1–2 sites of alkenyl unsaturation. Such alkenyl groups include ethenyl (—CH=$CH_2$), n-propenyl (i.e., allyl) (—$CH_2$CH=$CH_2$), iso-propenyl (—C($CH_3$)=$CH_2$), and the like.

The term "alkyl" refers to monovalent alkyl groups preferably having from 1 to 8 carbon atoms and more preferably 1 to 6 carbon atoms. This term is exemplified by groups such as methyl, ethyl, n-propyl, iso-propyl, n-butyl, iso-butyl, n-hexyl, and the like.

The term "aryl" refers to an unsaturated aromatic carbocyclic group of from 6 to 14 carbon atoms having a single ring (e.g., phenyl) or multiple condensed rings (e.g., naphthyl or anthryl). Preferred aryls include phenyl, naphthyl and the like.

The term "aryloxy" refers to the group aryl-O—where the aryl group is as defined herein including optionally substituted aryl groups as also defined herein.

The term "cycloalkyl" refers to cyclic alkyl groups or cyclic alkyl rings of from 3 to 8 carbon atoms having a single cyclic ring or multiple condensed rings which can be optionally substituted with from 1 to 3 alkyl groups. Such cycloalkyl groups include, by way of example, single ring structures such as cyclopropyl, cyclobutyl, cyclopentyl, cyclooctyl, 1-methylcyclopropyl, 2-methylcyclopentyl, 2-methylcyclooctyl, and the like, or multiple ring structures such as adamantanyl, and the like. Examples of suitable cycloalkyl rings include single ring structures such as cyclopentane, cyclohexane, cycloheptane, cyclooctane, and the like, or multiple ring structures such as bicyclo[2.2.1] heptane, bicyclo[3.2.1]octane, and the like. Preferred cycloalkyl rings include cyclopentane, cyclohexane, cycloheptane and bicyclo[3.2.1]octane.

It will be appreciated that these lists are far from exhaustive. As the examples demonstrate, the moieties which can properly "functionalize" the conjugated polymers can range from very simple groups presenting about 5 atom chains to much more complex groups such as cholestanoxy groups and the like. Examples of representative conjugated polymers as well as a few representative examples of functionalizing side groups are shown in FIG. 1. These specific conjugated polymers are representative only and not to be considered an exhaustive list. It will be appreciated that a suitable functionalized conjugated polymer might have a single repeating conjugated unit and a single repeating functionalizing unit but that other configurations are equally possible. For example, a mixture of two different "single conjugated moiety—single functionalizing moiety" polymers might be used. Similarly, a single polymer having a variety (two or more) of different conjugated repeat units and/or a variety of functionalizing groups copolymerized with one another might be used. Such materials are essentially copolymers, either block or random.

The functionalized conjugated polymers employed in the present invention may be present as neat materials. That is in a single polymer, undiluted and not mixed with other materials. Alternatively, the active lasing layers can be a mixture of two or more functionalized conjugated polymers in any proportion. In addition, it is not outside the scope of this invention to form concentrated blends of the functionalized conjugated polymers with other polymers and with other plastic product components such as plasticizers, lubricants, and the like. Such blends should contain an adequate proportion of conjugated material to permit a high level of lasing activity in the solid state. Typically, the higher the proportion of functionalized conjugated polymer, the more intense the laser response. However, one can dilute the conjugated polymer by as much as about one fold and sometimes even 10 fold with a nonconjugated polymer such as a poly(olefin), nylon, poly(styrene) and the like.

Examples of these functionalized conjugated polymers have been disclosed heretofore for use in other (nonlasing) applications. In those disclosures, representative syntheses are provided.

Laser Device Configurations

In prior art lasers it has been demonstrated that laser action can be achieved if the optical path length in the medium exceeds the gain length. A variety of laser configurations have been developed in prior art systems to promote or enhance laser action. These configurations find application as preferred embodiments of the application of the present invention.

For example, the optical path in the gain medium can be enhanced by multiple reflections at the surface of the film so as to cause the emitted light to propagate in an optical waveguide, or it can be enhanced by providing feedback as in a resonant cavity where the light passes back and forth many times within the cavity prior to exiting.

In the case of a cavity, the feedback serves at least two functions; to increase the path length of the radiation in the gain medium, and to provide a resonant structure that determines the specific frequencies which will be amplified above the threshold for laser emission. By restricting the allowed modes of the radiation field, resonant structures oscillate in specific modes with an associated spectral redistribution of the emission, increasing the intensity at some wavelengths at the expense of others [A. Yariv, Quantum Electronics, 3rd edn, (Wiley, New York, 1989 )].

In the case where the emitted light propagates in an optical waveguide, the path length in the medium can be greater than the gain length without feedback from a resonant structure. Resonant waveguide structures can be created by using distributed feedback (DFB). This is done by inducing a periodic spatial variation either of the refractive index or of the gain of the laser medium. Laser oscillation in the periodic structure created has feedback provided by backward Bragg reflection [H. Kogelnik and C. V. Shank, Appl. Phys.Lett. 18, 152 (1971)].

A variety of thin film DFB lasers have been demonstrated by using dye-doped polymers (e.g. Rhodamine 6G doped polymethylmethacrylate (PMMA)) [A. A. Zlenko, A. M. Prokhorov and V. A. Sychugov, Sov. J. Quant. Electron. 3, 493 (1974)]. In many cases, the films were built in such a way that they constituted waveguide structures (for example, by choice of substrate with appropriate index of refraction). Waveguiding mechanisms have been often used to create the interference patterns needed to achieve DFB [see D. Shamrakov and R. Reisfeld, Chem. Phys. Lett. 213, 47 (1993)].

In general, lasing in waveguide structures has been achieved with different types of materials: solids doped by rare earth ions [M. J. F. Digonnet and K. Liu, J. Lightwave Technol. 7, 1009 (1989)], dye-doped polymer films [H. Kogelnik and C. V. Shank, Appl. Phys. Lett. 18, 152 (1971)]) and liquid thin layers [G. Pendock, H. S. Mackenzie and F. P. Payne, Electron. Lett. 28, 149 (1992)]. Recently, lasing in dye doped silica-PMMA sol-gel composites has shown to overcome the instability problems commonly present in devices based on organic dyes [D. Shamrakov and R. Reisfeld, Chem. Phys. Lett. 213, 47 (1993)]. Nevertheless, a remaining problem of this type of structure is the limited concentration of chromophores in the matrix that can be achieved. This limitation results in a higher threshold for laser action. The latter problem is solved by using the functionalized conjugated semiconducting polymer materials from the class disclosed in this invention.

In a preferred embodiment, these polymer materials are in the form of thin films which exhibit gain narrowing.

In a more preferred embodiment, these polymers are in the form of thin films which exhibit gain narrowing, and which are neat and not diluted.

In a still more preferred embodiment, these polymers are in the form of thin films which exhibit gain narrowing, which are neat and non diluted, and which are thinner than 10 microns.

In a still more preferred embodiment, these polymers are in the form of thin films which exhibit gain narrowing, which are neat and non diluted, and which are thinner than 5 microns.

In a still more preferred embodiment, these polymers are in the form of thin films which exhibit gain narrowing, which are neat and non diluted, and which are thinner than 1 micron.

Still more preferred configurations the functionalized conjugated luminescent polymers which satisfy criteria 1 and criteria 2 in configurations such that they exhibit gain narrowing as thin solid state films, neat and nondiluted, at pump energies (energy per pulse) less than 100 ($\mu$J).

Even more preferred configurations present functionalized conjugated luminescent polymers which satisfy criteria 1 and criteria 2 in configurations such that they exhibit gain narrowing as thin solid state films, neat and nondiluted, at pump energies (energy per pulse) less than 10 $\mu$J.

Most preferred configurations present functionalized conjugated luminescent polymers which satisfy criteria 1 and criteria 2 such that they exhibit gain narrowing as thin solid state films, neat and nondiluted, at pump energies (energy per pulse) less than 1 $\mu$J.

In another preferred embodiment, the active layer in thin film lasers comprises a functionalized conjugated polymer, said thin film lasers being either optical lasers (optically pumped) or injection lasers (electronically pumped by electrical current injection).

In yet another preferred embodiment, the thin film in these thin film lasers is an optical waveguide and in which the emitted light is guided within the optical waveguide over lengths longer than the gain length within the polymer.

In a more preferred embodiment, the thin film lasers of this invention are either optical lasers or injection lasers with feedback wherein the feedback is realized through external mirrors.

In another preferred embodiment, the thin film lasers of this invention are either optical lasers or injection lasers with feedback wherein the feedback is realized through distributed feedback.

In yet another preferred embodiment, the thin film lasers of this invention are either optical lasers or injection lasers with feedback wherein the feedback is realized through dielectric mismatch reflection.

In yet another preferred embodiment, the thin film lasers of this invention are either optical lasers or injection lasers with feedback wherein the feedback is realized through fabrication of the thin film laser material within a microcavity. Such devices can take the form of a polymer light-emitting diode (LED) or a polymer light-emitting electrochemical cell (LEC).

Light-emitting diodes have been fabricated using semiconducting, luminescent polymers as the active materials. Polymer light-emitting diodes (LEDs) have been fabricated in two configurations; the sandwich cell configuration and the surface cell configuration. These configurations work well with the present polymers.

Thin film devices in the sandwich (multi-layer thin film) configuration comprise an active luminescent, semiconducting material laminated between two planar electrodes. One of the electrodes is made semi-transparent, thereby allowing the emitting light to exit from the device. Inorganic materials (such as ZnS:Mn), organic materials such as organic dye molecules [C. W. Tang and S. A. Van Slyke, Appl. Phys. Lett. 51 (1987) 913; J. Appl. Phys. 65 (1989) 3610] and conjugated polymers [H. Burroughes, D. D. C. Bradley, A. R. Brown, R. N. Marks, K. Mackay, R. H. Friend, P. L. Burns and A. B. Holmes, Nature 347, 539 (1990); D. Braun and A. J. Heeger, Appl. Phys. Lett. 58 1982 (1991)] have been used in this general type of electroluminescent device.

In the surface cell configuration, electrodes are pre-prepared onto a substrate with a gap in between [U. Lemmer, D. Vacar, D. Moses, A. J. Heeger, T. Ohnishi and T. Noguchi, Appl. Phys. Lett. 68, 3007 (1996)]. That substrate can be polycrystalline, glass, plastic or a single crystal of, for example, silicon. Alternatively, that substrate can be a free standing film of a semiconducting luminescent polymer. The injecting electrodes can be fabricated on the substrate by, for example, thermal evaporation, electron beam evaporation, sputtering, chemical deposition and so on. The electrodes can be patterned either with a shadow mask or by means of photolithographic techniques well known in the art. To increase the active device area (i.e. to increase the length/width ratio of the gap between electrodes), the electrodes can be fabricated in an interdigitated pattern as demonstrated, for example, for light-emitting electrochemical cells (LECs) [Q. Pei, G. Yu, C. Zhang, Y. Yang and A. J. Heeger, Science, 269, 1086 (1995)].

A number of methods are well known in the art for providing the feedback necessary in the fabrication of lasers [A. Yariv, Quantum Electronics, 3rd edn, (Wiley, New York, 1989)], including, for example, external mirrors, distributed feedback {H. Kogelnik and C. V. Shank, Appl. Phys. Lett. 18, 152 (1971)], dielectric mismatch reflection, and microcavities [H. Yokoyama, Science, 256, 66, 1992)]. Each of these can be used to fabricate solid state lasers, and in particular thin film solid state lasers, with the presently selected semiconducting polymers as the active medium. The critical ingredient is the achievement of significant gain. In the case of thin film configurations, as in the sandwich cell architecture of the polymer LED or the polymer LEC, it is advantageous to have materials in which the gain is sufficient to allow laser action from thin films in the micron and sub-micron regime because polymer LEDs and polymer LECs operate best (high brightness at low voltage) when the active medium in the device has a thickness less than 1 micron.

The following general methods and specific examples are presented to illustrate the invention and are not to be construed as limitations thereon.

EXAMPLES

Example 1

A solution of BuEH-PPV (chemical structure is shown in FIG. 1) in p-xylene, at a concentration of 1% w/v, was prepared by stirring at room temperature in a sealed environment where the oxygen level was minimized by a constant flow of high purity nitrogen. The solution was vigorously stirred until the polymer was dissolved.

A glass substrate for film preparation was obtained by cutting a commercially available microscope slide (7.5 cm×2.5 cm×1 mm) into a 1.5 cm×1.5 cm square. It was cleaned by sonication in reagent grade acetone for 20 minutes followed by sonication in reagent grade 2-propanol for 20 minutes. The substrate was then dried in an oven at 170° C. and introduced into the nitrogen chamber via a vacuum port.

The nitrogen chamber was equipped with a spin casting apparatus which allows film preparation to be carried out in the nitrogen environment. Approximately 70 μl of solution was poured onto the substrate and the substrate was spun at a speed of 750 revolutions per minute (rpm). As soon as the film was dry, an additional 70 μl of solution was poured onto the substrate and the substrate was again spun at a speed of 750 rpm until the film was dry. This gave a high optical quality film with a thickness of 210 nm, as determined with a Dektak surface profilometer. The sample was stored in the nitrogen chamber until immediately before the optical characterization experiment described below.

The optical characterization experimental setup for testing the lasing behavior of our films has been described in detail [F. Hide, B. J. Schwartz, M. A. Díaz-García, and A. J. Heeger, Chem. Phys. Lett 256, 424 (1996)]. The experimental setup is shown schematically in FIG. 3. These experiments were performed at room temperature in ambient atmosphere. The frequency doubled output (532 nm) of a 10 Hz, Q-switched Nd:YAG laser (Spectra Physics Quanta-Ray DCR-3) was passed through a high pressure $H_2$ cell. We used a prism to select the first anti-Stokes Raman line from the $H_2$ cell (435 nm) as the excitation source. The ~10 ns pulses, focused to a spot size of ~1.5 mm, were incident on the samples at an angle of approximately ~30°. The energy of the pulses was selected with calibrated neutral density filters that were held in the beam path. The emission that passed through a ~2 mm aperture placed normal to the front face of the sample was collected, frequency dispersed in a single monochromator (Spex), and detected by a Peltier-cooled CCD array (Photometrics).

PL spectra were recorded under optical pumping at two different pump energies and are presented in FIG. 3. The dotted curve shows the broad PL spectrum at 0.09 μJ per pulse. On the other hand, when pumped at a higher energy, 10.0 μJ per pulse (thick solid curve), there is a gain-narrowed peak and the tails of the luminescence are suppressed. In order to accommodate the two graphs in the same figure, the spectrum for 10.0 μJ per pulse excitation has been scaled down by 100.

This example demonstrates that under sufficiently energetic optical pumping, the emission spectrum of a thin BuEH-PPV film (210 nm thickness) on a glass substrate in the ambient atmosphere exhibits gain narrowing.

Example 2

In this example, we used the sample identical to that described in Example 1. The sample was characterized optically in a manner analogous to that described in Example 1 except that PL spectra were recorded for a range of energies from 0.05 to 200 μJ/pulse. For each PL spectrum, the linewidth, defined as full width at 1/e height, was determined. This definition of the linewidth is more suitable (compared to other definitions such as FWHM or full-width at half-maximum) for comparison of disparate PL spectra with varying magnitudes of vibronic features. The evolution of the linewidth as a function of the pump pulse energy is shown on a log scale in FIG. 4. The dramatic collapse of the line width (from 130 nm to 9 nm) at very low pumping energies ($\leq 1$ μJ) indicates that these undiluted thin films (210 nm thickness) exhibit laser action with a very short gain length.

This example demonstrates that there is well-defined threshold in the pump energy (~0.2 μJ/pulse) above which the thin BuEH-PPV film (210 nm thickness) exhibits gain narrowing.

Example 3

Thin films of various polymers with PPV, PPP, and PF backbones were prepared. The $\pi$-$\pi$* energy gaps of these polymers span the visible spectrum and various material properties. The polymers that were used in the example are listed with their abbreviations in the first column of Table 1 and their full chemical names at the bottom of same Table. BuEH-PPV, BCHA-PPV, MEH-PPV, BEH-PPV, and MOC1C10-PPV are polymers with PPV backbone structures and the appropriate functionalized side chains attached thereto. The chemical structures of these PPV derivatives are shown in FIG. 1. BuEH-MEH copolymers are polymerized from varying ratios of monomers of BuEH-PPV and MEH-PPV, and hence have a mixture of these functionalized side chains attached to the PPV backbone. These copolymers were synthesized with 5 different monomer ratios as listed in Table 1. HEH-PF and BDOO-PF are polymers with PF backbone structures and appropriate functionalized chains attached thereto. CN-PPP is a polymer with a PPP backbone structure with the appropriate functionalized side chain attached thereto. MEH-PPV, HEH-PF, BDOO-PF, and CN-PPP were obtained from UNIAX Corp., Santa Barbara, Calif., and were used as received. The other polymers in Table 1 were synthesized at the Institute for Polymers and Organic Solids at the University of California, Santa Barbara.

TABLE 1

| Material | Peak PL emission (nm) | $\lambda_{pump}$ (nm) | Energy Threshold (mJ/pulse) | Final Linewidth (nm) | Film Thickness Range (nm) | Cutoff Thickness (nm) | Solvent |
|---|---|---|---|---|---|---|---|
| BuEH-PPV[a] | 520, 560 | 435 | 0.4 ± 0.2 | 12 | 126–252 | 106 £ Th £ 126 | THF |
|  |  |  | 0.2 ± 0.1 | 9 | 87–208 | 65 £ Th £ 87 | p-xylene |
| BCHA-PPV[b] | 540, 630 (sh) | 532 | 1.0 ± 0.4 | 11 | 277–650 | 160 £ Th £ 277 | THF |
| MEH-PPV[c] | 585, 625 | 532 | 1.1 ± 0.4 | 17 | 87–405 | 53 £ Th £ 87 | THF |
|  |  |  | 3 | 50 | 355 | <355 | CB |
|  |  |  | 4 | 55 | 325 | <325 | p-xylene |
| BEH-PPV[d] | 580, 650 | 532 | 0.5 | 13 | 300 | <300 | THF |
| MOCC10-PPV[e] | 530, 620 | 532 | 4 | 16 | 310 | <310 | THF |

TABLE 1-continued

| Material | Peak PL emission (nm) | λpump (nm) | Energy Threshold (mJ/pulse) | Final Linewidth (nm) | Film Thickness Range (nm) | Cutoff Thickness (nm) | Solvent |
|---|---|---|---|---|---|---|---|
| BuEH-MEH Copolymers[f] | | | | | | | |
| 10:90 | 580, 625 | 532 | 3.2 | 23 | 330 | <330 | THF |
| 70:30 | 565, 600 | 532 | 1.0 | 15 | 420 | <420 | THF |
| 90:10 | 550, 580 (sh) | 435 | 1.0 | 20 | 370 | <370 | THF |
| 95:5 | 545, 580 (sh) | 435 | 1.6 | 20 | 450 | <450 | THF |
| 97.5:2.5 | 540, 570 (sh) | 435 | 1.0 | 18 | 500 | <500 | THF |
| HEH-PF[g] | 425, 445 | 355 | 4.2 | 12 | 120 | <120 | THF |
| BDOO-PF[h] | 430, 450, 540 | 355 | 2.3 | 7 | — | — | THF |
| CN-PPP[i] | 420 | 355 | 4 | 12 | 100 | <100 | THF |
| DCM/PS[j] (2.6% w/v) | 640 | 532 | 400 ± 150 | 23 | 390–4800 | 260 £ Th £ 390 | THF |

[a]poly(2-butyl-5-(2'-ethylhexyl)-1,4-phenylenevinylene);
[b]poly(2,5-bis(cholestanoxy)-1,4-phenylene vinylene);
[c]poly(2-methoxy 5-(2'-ethylhexyloxy)-1,4-phenylenevinylene);
[d]poly(2,5-bis(2'-ethylhexyloxy)-1,4-phenylene vinylene);
[e]poly(2-methoxy-5-(2,7-dimethyl-octyloxy)-1,4-pheneylenevinylene);
[f]copolymers synthesized from varying ratios of BuEH-PPV and MEH-PPV monomers;
[g]poly(9-hexyl-9-(2'-ethyl-hexyl)-fluorene-2,7-diyl);
[h]poly(9,9-bis(3,6-dioxaoctyl)-fluorene-2,7-diyl);
[i]poly(2-(6'-5cyano-6'-methyl-heptyloxy)-1,4-phenylene);
[j]4-(dicyanomethylene)-2-methyl-6-(4-dimethylaminostyryl)-4H-pyran The polymers were dissolved in the solvents listed in Table 1: tetrahydrofuran (THF), p-xylene, and chlorobenzene (CB). Because of the affinity of THF for atmospheric moisture, it was thoroughly dried in a distillation apparatus immediately before being used for any sample listed in Table 1. For BuEH-PPV and MEH-PPV, polymer solutions were prepared in different solvents (see Examples 13 and 14). Sample preparation was carried out in a manner similar to that described in Example 1. The polymer concentration in the appropriate solvent was varied in the range 0.5–5% w/v and spin casting spin speed in the range 750–4800 rpm, respectively. For each substrate, spin casting was carried out once or twice depending on desired thickness.

For BuEH-PPV, BCHA-PPV, and MEH-PPV (spin cast from THF only), multiple samples of different thicknesses were fabricated by appropriately varying polymer concentration in solvent and spin casting spin speed. Film thicknesses were determined with a Dektak surface profilometer.

The polymer films detailed in Table 1 were characterized optically in a manner analogous to that described in Examples 1 and 2, with the exception that the excitation wavelengths were modified as described below. In the experimental setup, three different pump wavelengths, 532 nm, 435 nm, and 355 nm, are readily available. The frequency doubled output (532 nm) or frequency tripled output (355 nm) of the Nd:YAG laser can be used directly on the sample. In addition, the frequency doubled output of the Nd:YAG laser can be used to pump a high pressure $H_2$ cell, from which the first anti-Stokes line (435 nm) emerges. For each polymer, the appropriate excitation wavelength was chosen in order to get the maximum linear absorption. The pump wavelength for each polymer is listed in Table 1.

All polymers listed in Table 1 presented well-defined energy thresholds on the order of 1 µJ/pulse, above which gain narrowing occurred, and below which the broad spontaneous emission spectra were seen. The energy thresholds for gain narrowing and the final linewidths after gain narrowing are listed in Table 1. In addition, for reference, the peaks in the spontaneous emission spectra are also listed in same Table. Note, however, that in some cases, for example, in the case of MEH-PPV, the gain narrowing is modest and the final linewidths are quite broad.

This example demonstrates that under sufficiently energetic optical pumping, the emission spectra of thin films (with sub-micron thickness) of the polymers in Table 1 on glass substrates in ambient atmosphere exhibit gain narrowing. A well defined energy threshold in the pump energy is evident, typically around ~1 µJ/pulse, and in a number of cases well below 1 µJ/pulse, above which gain narrowing is observed.

Example 4

For comparison to polymers used in Example 3, films of the laser dye DCM suspended in polystyrene (PS), with optical densities comparable to the thin BuEH-PPV film described in Example 1, were made. The properties of DCM as a laser dye were first investigated in P. R. Hammond, Opt. Commun. 29, 331 (1979). The full name of DCM is shown at the bottom of Table 1.

Laser grade DCM dye and polystyrene (MW=50,000) were obtained from Exciton Inc., Dayton, Ohio, and Polysciences, Inc., Warrington, Pa., and were used as received. DCM was dissolved in THF at a concentration of 1% w/v. The DCM/THF solution, PS, and additional THF were combined and stirred to yield a solution with DCM/PS concentration of 2.6% and PS/THF concentration ranging from 10 to 50% . The resulting mixture was mixed thoroughly and spin cast on glass substrates as in Examples 1–3, with spin casting speeds ranging from 750 to 4800 rpm. The variations in PS/THF concentration and spin casting spin speed were used to control the film thicknesses between 100 to 7800 nm.

The DCM/PS samples were characterized optically as in Examples 1–3, but with 532 nm pumping. The experimental results are summarized in Table 1. Even though the DCM/PS concentration in these films is more than two order of magnitude higher than in typical dye lasers [Ulrich Brackmann, *Lambdachrome Laser Dyes*, 2nd revised edition, Lambda Physik, Göttingen, Germany, 1994] the energy threshold for gain narrowing is over 1000 times higher than that of BuEH-PPV, as shown in Table 1. Thus, conjugated polymers provide the intense absorption and emission characteristics of organic dyes, but with the substantial advantage of having a much higher density of chromophores in the solid-state.

This Example demonstrates that conjugated polymers comprise a class of materials more suitable than conventional organic dyes for solid-state lasing applications. As demonstrated in Table 1, in the case of semiconducting polymer laser materials, the energy threshold for gain narrowing is over 1000 times lower than that of DCM in the solid state.

Example 5

Figure 6A:
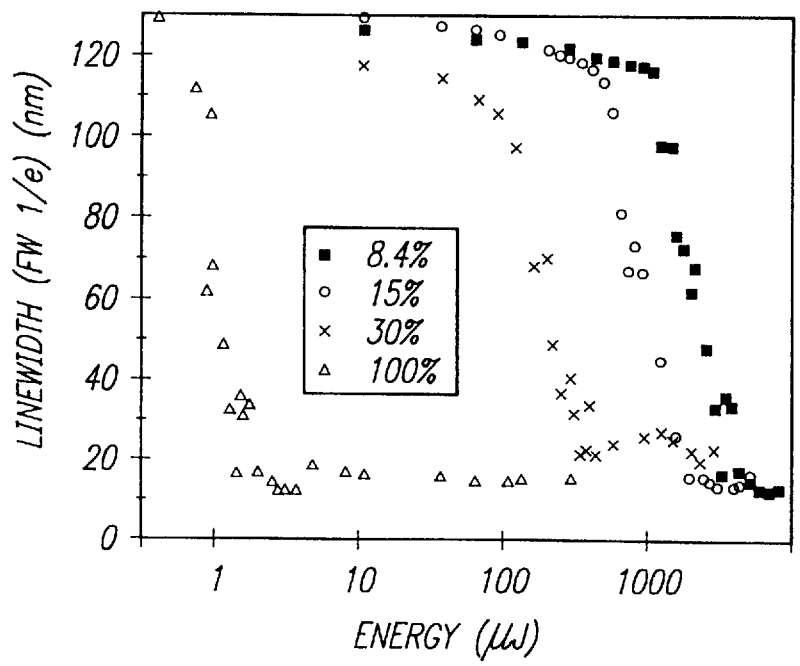
FIG. 6a is a plot of emission line width as a function of pump pulse energy (on a log scale) for various BCHA-PPV/PS blend films at different BCHA-PPV concentrations: 8.4% (squares), 15% (open circles), 30% (crosses) and neat (100%) (open triangles).
Figure 6B:
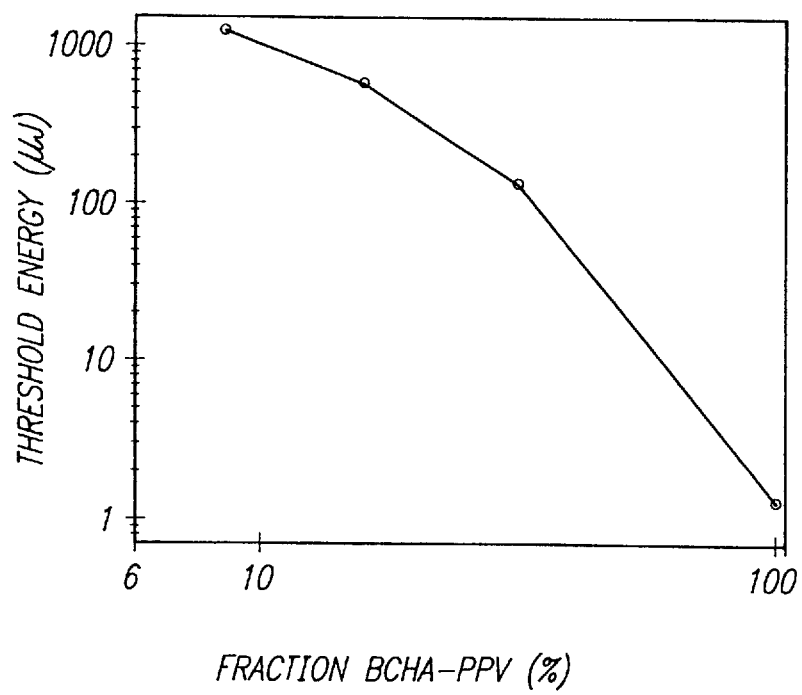
FIG. 6b is a plot of the threshold for gain narrowing as a function of the fraction of BCHA-PPV in the blend.

Thick films of BCHA-PPV suspended in polystyrene (PS) were made in the manner described below. PS (MW=50,000) was obtained from Polysciences, Inc. and was used as received. BCHA-PPV was dissolved in THF at a concentration of 3% w/v. The BCHA-PPV/THF solution, PS, and additional THF were combined and stirred to yield solutions with BCHA-PPV/PS concentration of 8.4%, 15%, 30%, and 100%, and PS/THF concentration of 20% w/v. The resulting mixtures were mixed thoroughly, drop cast on glass substrates, and allowed to dry in a nitrogen environment. The films were characterized optically as in Examples 1–3. FIG. 6 shows the emission line width as a function of pump pulse energy (on a log scale) for various BCHA-PPV/PS blend films at different BCHA-PPV concentrations: 8.4% (squares), 15% (open circles), 30% (crosses) and neat (100%) (open triangles). A significant decrease in the energy threshold is observed at higher BCHA-PPV concentrations, reaching a minimum of 1.3 $\mu$J for the neat film.

This Example demonstrates the advantage offered by the high density of chromophores in solid-state films of conjugated polymers, neat and undiluted, as compared to films in which the density of chromophores is deliberately lowered by dilution in an inert matrix.

Example 6

Thin films of BuEH-PPV of different thickness were prepared by spin casting onto glass substrates from solutions in THF as in Examples 1–3. The resulting film thicknesses ranged between 27 and 252 nm.

Figure 7:
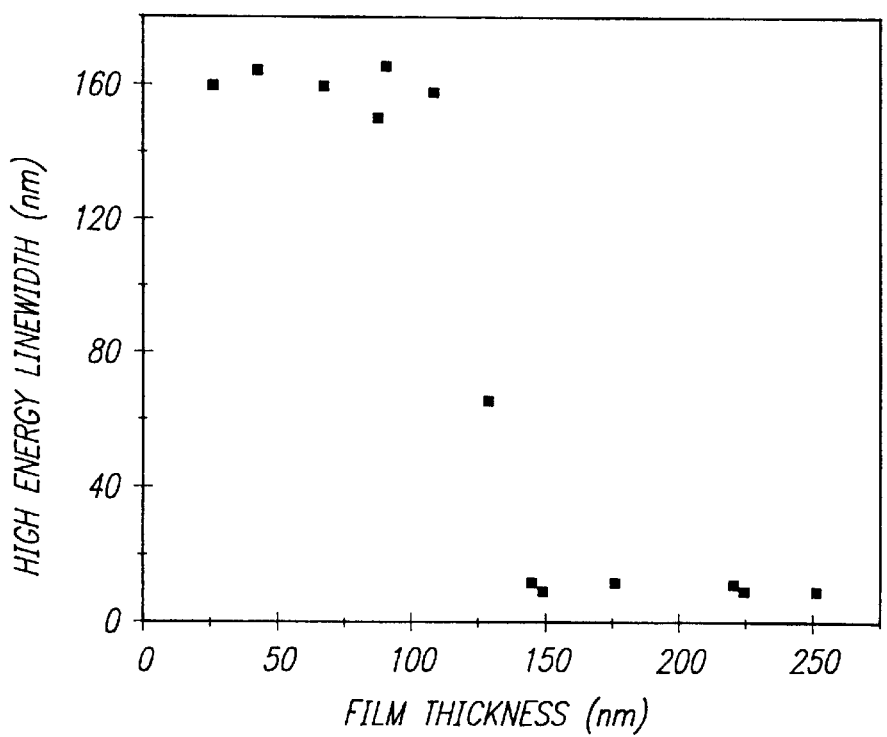
FIG. 7 is a plot of the line width of the PL spectrum of BuEH-PPV at high pump energy as a function of the film thickness.

The films so fabricated were characterized optically as in Examples 1–3, with the pump wavelength at 435 nm and pump energies ranging between 0.05 and 200 $\mu$J per pulse. In this range of pump energies, films with thickness below 106 nm showed broad PL spectra with vibronic side bands in all cases. No gain narrowing was observed. Films with thickness greater than 126 nm showed broad PL spectra at low energies (<0.1 $\mu$J per pulse). At higher pump energies (>0.4 $\mu$J per pulse) the PL spectrum exhibited gain narrowing. The line width of the PL spectrum at high pump energy as a function of the film thickness is shown in FIG. 7. A well defined thickness cutoff is evident around 116±10 nm.

This example demonstrates that for neat, undiluted thin films of BuEH-PPV on glass there is a thickness cutoff of 116±10 nm, below which gain narrowing is not observed. As shown in Examples 8, 9 and 10, this thickness cutoff originates from the thin semiconducting polymer film functioning as an optical waveguide.

Example 7

Thin films of BCHA-PPV and MEH-PPV of different thickness were prepared as in Examples 1–3. Films thickness ranged between 160 nm and 650 nm for BCHA-PPV and between 52 nm and 405 nm for MEH-PPV.

The films so fabricated were characterized optically as in Examples 1–3, with the pump wavelength at 532 nm and pump energies ranging between 0.05 and 200 $\mu$J per pulse. Both BCHA-PPV and MEH-PPV exhibited the same type of thickness dependence as BuEH-PPV in Example 6. A well defined thickness cutoff was evident around (215±60) nm in BCHA-PPV and around (70±17) nm in MEH-PPV.

This example demonstrates that for neat, undiluted thin films of BCHA-PPV and MEH-PPV on glass, there is a thickness cutoff (215±60) nm for BCHA-PPV and (70±17) nm for MEH-PPV, below which gain narrowing is not observed. This conclusion may be extended to any polymer of Table 1 deposited over glass. As shown in Examples 8, 9 and 10, this thickness cutoff originates from the thin semiconducting polymer film functioning as an optical waveguide.

Example 8

Free standing films of BuEH-PPV were made in the manner described below. BuEH-PPV was dissolved in THF at a concentration of 1% w/v. The solution was drop cast on glass substrates and allowed to dry in a nitrogen environment. The films were removed from the glass substrate and characterized optically as in the Example 1–3. The refractive index (n) and the thickness of the free standing film was determined from modal waveguide characterization by the prism coupling technique in a standard Metricon apparatus.

The film showed birefringence: the refractive index in the plane of the film, determined from the angular position of the TE modes, was n=1.69; from the angular position of the TM modes, the refractive index in the direction perpendicular to the plane of the film was determined as 1.55. The thickness of the film was around 5 $\mu$m.

Therefore, the BuEH-PPV films cast over glass in previous examples constitute asymmetric planar waveguides: air (n=1)–BuEH-PPV film (n=1.69)–glass (n=1.52). It is known that for this type of structure, a cutoff film thickness ($h_{cutoff}$) exists, below which the fundamental mode cannot be propagated [H. Kogelnik, in Topics in Appl. Optics: Integrated Optics, T. Tamir, Ed. (Springer-Verlag, Berlin, 1979), vol. 7, chap. 2.].

This cutoff thickness may be calculated through the following expression: (1)

where $\gamma$ is the wavelength of the guided light and c, f and s refer to cover, film and substrate respectively. In this Example, c=air, f=BuEH-PPV film and s=glass. From Eq. 1, we calculated $h_{cutoff}$=120 nm for a BuEH-PPV film on glass. This value is in very good agreement with the thickness threshold below which gain narrowing was not experimentally observed (see Example 6).

This example demonstrates that for BuEH-PPV films over glass the thickness cutoff for the observation of gain narrowing corresponds to the thickness cutoff required in an asymmetric waveguide for the fundamental mode to be propagated.

Example 9

The same film fabrication and refractive index measurement procedure as in example 8 was used in this example on BCHA-PPV. The experimentally measured refractive indices were n=1.60 in the plane of the film and n=1.53 in the perpendicular direction to the plane of the plane. The cutoff thickness for an asymmetric waveguide (air-BCHA-PPV film-glass) calculated from Eq. 1, is $h_{cutoff}$=200 nm. This value is in very good agreement with the thickness threshold below which gain narrowing was not experimentally observed (see Example 7).

This Example demonstrates that for BCHA-PPV films on glass, the thickness cutoff for the observation of gain narrowing corresponds to the thickness cutoff required in an asymmetric waveguide for the fundamental mode to be propagated. This conclusion may be generalized to the usage of any other polymer of Table 1, deposited on any type of substrate that has a refractive index lower than that of the polymer.

Example 10

A 43 nm thick BuEH-PPV film (prepared in Example 6) that was too thin to show line narrowing as an asymmetric waveguide in air, was immersed in a solvent that was approximately index matched to the glass substrate (cyclohexanone, n=1.45). This produced a configuration with a symmetric waveguide structure (glass-polymer-solvent), where no minimum film thickness for waveguiding is expected.

Once in the solvent, the film showed dramatic line narrowing at pump energies larger than 1 µJ per pulse. This process is reversible: the laser behavior disappears when the film is removed from the solvent.

This example demonstrates that waveguiding in BuEH-PPV films deposited over glass substrates is primarily responsible for the waveguide confinement of the emitted photons and to low lasing thresholds in sub-micron thick films. This conclusion may be generalized to any other polymer of Table 1, deposited on any type of substrate that has a refractive index lower than that of the polymer.

Example 11

A thin film of BuEH-PPV (n=1.69) was prepared by spin casting onto an optically flat sapphire substrate (n=1.76) from THF solution. The film fabrication procedure is analogous to those in Examples 1–3, and the resulting film thickness was 440 nm. The optical characterization experiment is as described in Examples 1–3. The PL spectrum recorded in the standard configuration (pumping directly over the film) showed only limited gain narrowing. However, exciting the film through the sapphire led to strong gain narrowing.

This type of behavior was explained in terms of waveguiding in the substrate, in the same manner as it is discussed in a previous work on dye doped sol-gel composites, where laser operation in thin films was observed to result from the same substrate waveguiding mechanisms. Waveguiding in the substrate provides some confinement (through the evanescent wave) of the emitted photons in the active medium, that is big enough to exhibit gain narrowing.

The thin film was immersed in a high-index solvent (diiodomethane, n=1.75). Regardless of the pumping geometry, the gain narrowing was inhibited. This behavior is consistent with the fact that the waveguiding effect disappears due to index matching of solvent and sapphire.

This example demonstrates that waveguiding in the substrate is the dominant process for the observation of gain narrowing in BuEH-PPV films deposited over sapphire.

Example 12

A thin film of BCHA-PPV (n=1.60) was prepared by spin casting onto an optically flat sapphire substrate (n=1.76) from THF solution. The film fabrication procedure is analogous to those in Examples 1–3. The same type of experiments were performed as in Example 11, and the same type of behavior was observed, namely a dependence of the lasing behavior on the side of sample being pumped.

This example demonstrates that waveguiding in the substrate is the dominant process for the observation of gain narrowing in BCHA-PPV films deposited over sapphire. This conclusion may be generalized to the usage of any other polymer of Table 1, deposited over any type of substrate that has a refractive index higher that of the polymer.

Example 13

Optical characterization data on thin films of BuEH-PPV in Example 7 were analyzed with particular attention paid to the possible influence of the solvent from which the films were cast. As seen in Table 1, similar threshold energies for gain narrowing and similar final line widths were obtained for both solvents.

This example demonstrates that for BuEH-PPV, the stimulated emission is not affected by the type of solvent from which the thin films are spin cast.

Example 14

The experiments of Example 13 were repeated using MEH-PPV films cast from THF, p-xylene, and chlorobenzene (CB).

Figure 8:
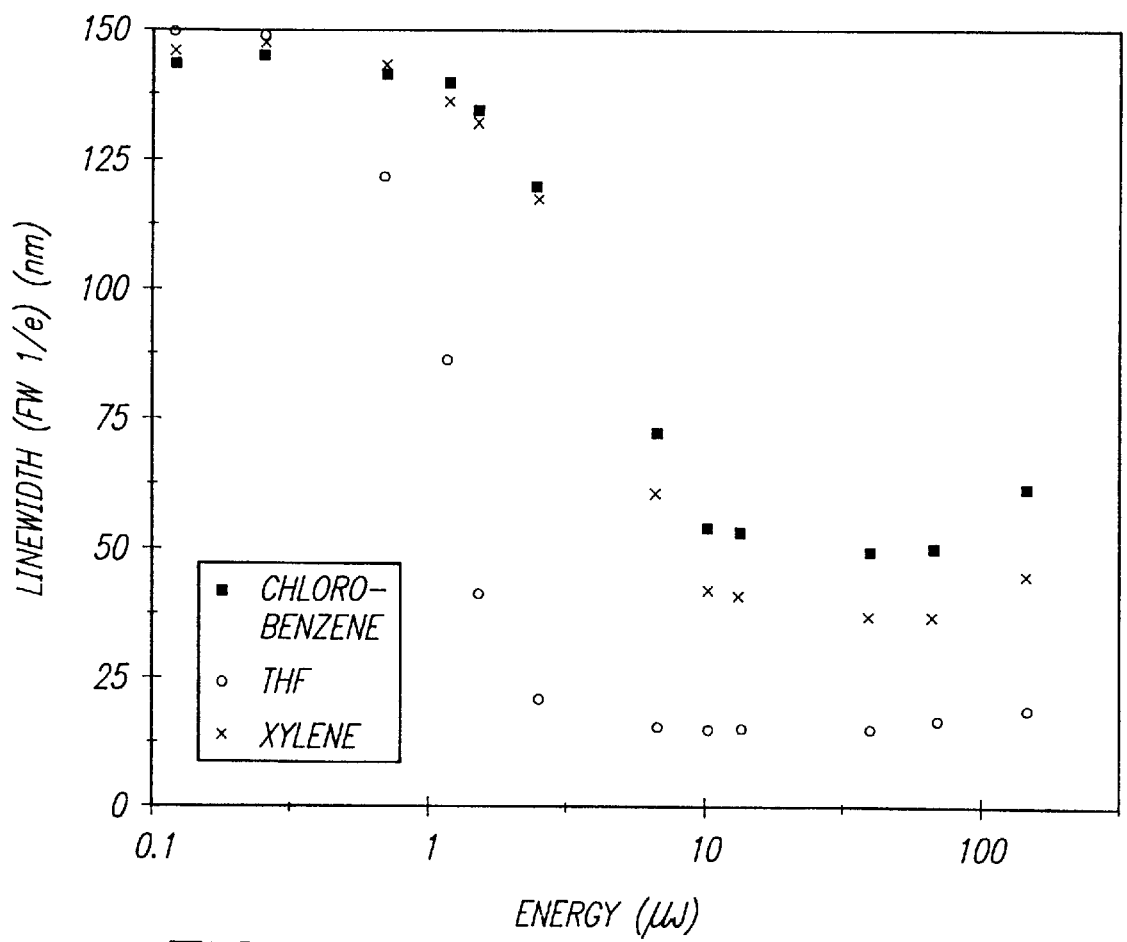
FIG. 8 is a plot of emission line width as a function of pump pulse energy (on a log scale) for MEH-PPV neat films cast on glass from different solvents: tetrahydrofuran (open circles), p-xylene (crosses), and chlorobenzene (squares).

The gain narrowing is strongly dependent in the choice of solvent, as shown in FIG. 8. Emission line width as a function of pump pulse energy (on a log scale) for MEH-PPV neat films cast on glass from different solvents: tetrahydrofuran (open circles), p-xylene (crosses), and chlorobenzene (squares). Films cast from THF showed a narrow final line width (17 nm), in contrast with the broad final widths ($\geq$50 nm) obtained from films cast from CB and p-xylene (see Table 1). In addition, the threshold for what little line narrowing occurred in films cast from the aromatic solvents was ~4 times higher than in films cast from THF.

This example demonstrates that for MEH-PPV, the stimulated emission is strongly affected by the type of solvent from which the thin films are spin cast. The same material can satisfy the three criteria for semiconducting polymers as laser materials, or not, depending on from which solvent the film was cast. Thus, solvent dependence of chain packing appears to offer an alternative way to control or enhance the stimulated emission.

Example 15

Figure 9:
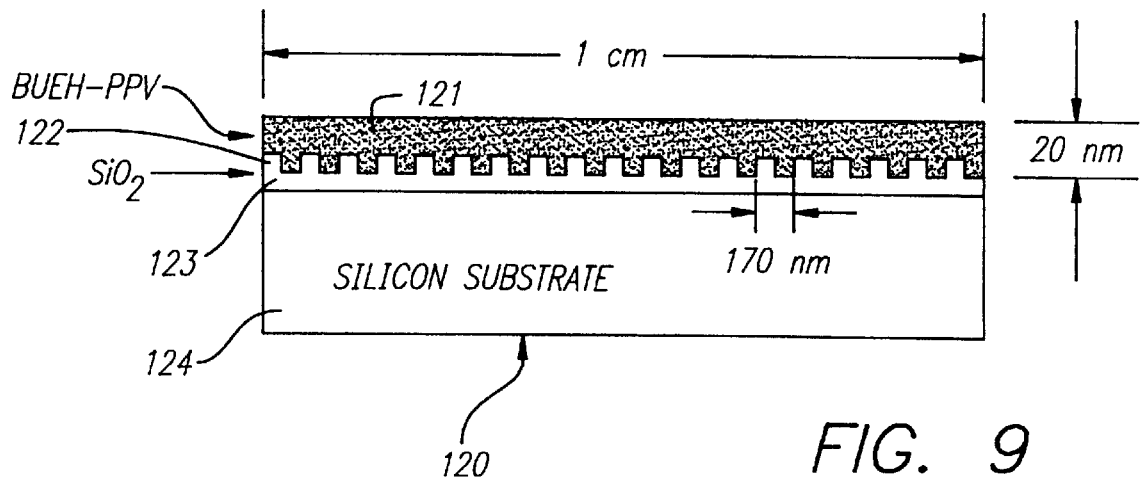
FIG. 9 is a schematic cross-sectional view of a laser device of the present invention showing typical structure capable of achieving distributed feedback (DFB).

The distributed feedback (DFB) structure 120 shown in FIG. 9 was made by spin casting a 200 nm thick film of BuEH-PPV 121 on sub-micron period DFB gratings 122 in silicon dioxide layer 123. The gratings were prepared using a holographic setup. A 1 µm thick film 123 of silicon dioxide was deposited on a silicon substrate 124 by plasma enhanced chemical vapor deposition. A 700 Å thick film of photoresist was then spin-cast onto the substrate. The photoresist was then exposed to the interference pattern of two cw UV beams from a He—Cd laser. Following the development of the photoresist in a developer, the grating pattern was transferred into the silicon dioxide by plasma etching with $CF_4$ gas. Etch depths were varied from 2 nm to 20 nm.

Figure 10:
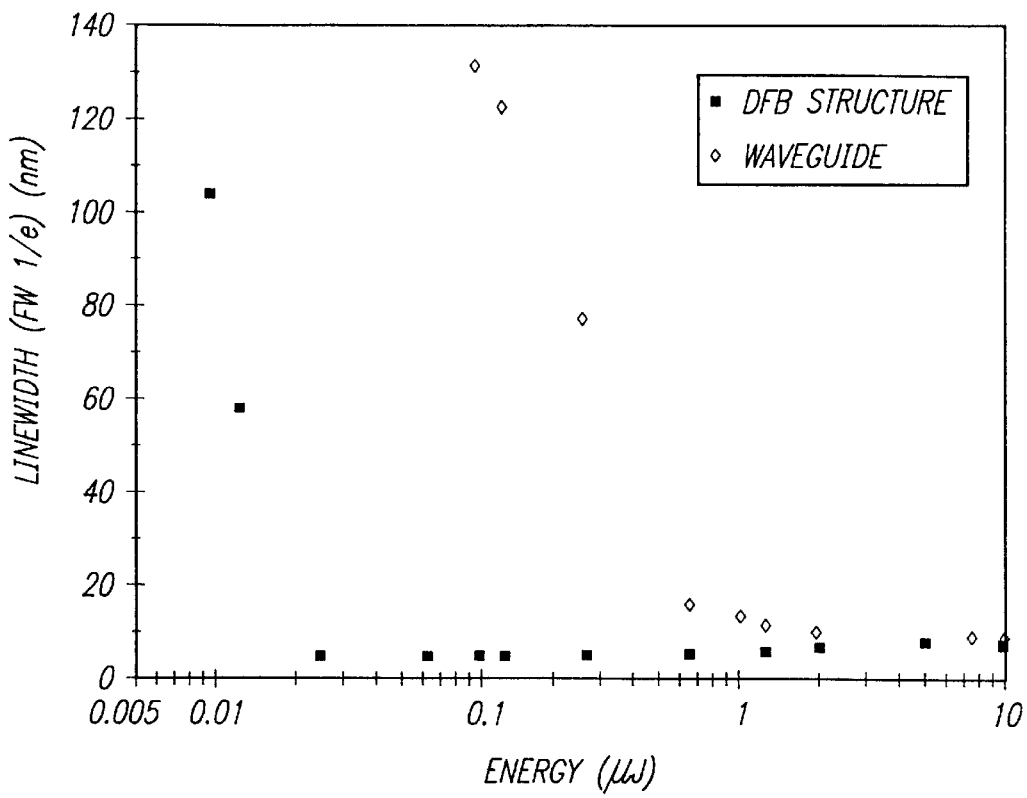
FIG. 10 is a plot of linewidth vs pump energy (per pulse) data for a BuEH-PPV film on a distributed feedback grating (solid squares); see FIG. 9 for a diagram of the distributed feedback grating structure. For comparison, the data for a thin film waveguide structure without distributed feedback are also shown on FIG. 10 (open diamonds), the threshold for gain narrowing was reduced by more than a factor of twenty for the BuEH film spin-cast onto the distributed feedback grating.

When the BuEH-PPV films on DFB gratings (160 Å etch depth) were optically pumped at 435 nm as described in Example 1, the threshold for gain narrowing occurred at approximately 10 nJ; the linewidth vs pump energy (per pulse) data are shown in FIG. 10 (solid squares). For comparison, the data for a thin film waveguide structure without DFB are also shown on FIG. 10 (open diamonds), the threshold for gain narrowing was reduced by more than a factor of twenty for the BuEH film spin-cast onto the DFB grating.

This Example shows that low threshold distributed feedback lasers can be fabricated using semiconducting polymers as the gain material.

Example 16

Gain narrowing and lasing from a soluble, highly photoluminescent conjugated polymer, poly(2-butyl, 5-(2'ethylhexyl)-1,4-phenylene vinylene) (BuEH-PPV) were demonstrated using microcavities. Microcavities consisted of simple layered structures DBR/PVK/BuEH-PPV/Ag or DBR/BuEH-PPV/PVK/Ag where DBR stands for a highly reflective Distributed Bragg Reflector (one mirror of the microcavity) and Ag (silver) formed the other mirror of the microcavity. For fabricating the microcavities, polymer films were prepared in nitrogen atmosphere by spin-casting from solution onto DBR mirrors. Film thicknesses were measured with a Dektak profilometer. Solvents were chosen so that they would not dissolve any underlying polymer films during spin-casting of bilayers. BuEH-PPV was dissolved at concentrations from 1 to 1.5% w/v in p-xylene and spin-cast to thicknesses of from ~470 nm. PVK films with thicknesses from ~90 nm to ~900 nm were spin case from cyclohexanone with concentrations varying from 1.5 to 10% w/v. Film quality was generally good, with no macroscopic inhomogeneities. The transmittance of the silver layer (~60 nm, deposited by thermal evaporation at $2\times10^{-6}$ torr) at 435 nm was 11%. Microcavities were processed and stored in inert environment until immediately before use; the optical experiments were carried out under ambient conditions.

The DBR mirrors (type BBD1), obtained from CVI Laser Inc., have nominally greater than 99% reflectivity at normal incidence from 488–694 nm. The DBR consists of ¼-wavelength dielectric layers (>60) with alternating high ($\approx 2.2$) and low ($\approx 1.4$) index. The high reflectivity over such a broad wavelength range results from the many layers with different layer thicknesses (chirped DBR) such that longer wavelengths are reflected deeper inside the stack. As a result, each microcavity supported several modes.

Since microcavities have relatively high Q and efficiently couple emitted photons to only a few cavity modes [J. Gruner, F. Cacialli and R. H. Friend, J. Appl. Phys. 80, 207 (1996); V. Cimrova and D. Neher, J. Appl Phys. 79, 3299 (1996); V. Cimrova, U. Scherf and D. Neher, Appl. Phys. Lett. 69, 608 (1996); M. Berggren, O. Inganas, T. Granlund, S. Guo, G. Gustafsson, and M. R. Andersson, Synth. Met. 76, 121 (1996)]. The emission peaks are quite narrow ($\leq 7$ nm) even below threshold. Above threshold, the emission peak nearest the gain maximum (550 nm for BuEH-PPV) grew in intensity more rapidly than the other emission peaks as the pump energy increases. Thus, following N. Tessler, G. J. Denton and R. H. Friend, Nature, 382, 695 (1996), we defined the mode ration as the ratio of the integrated power of the lasing mode to that of one of the other spontaneous emission modes.

Figure 11A:
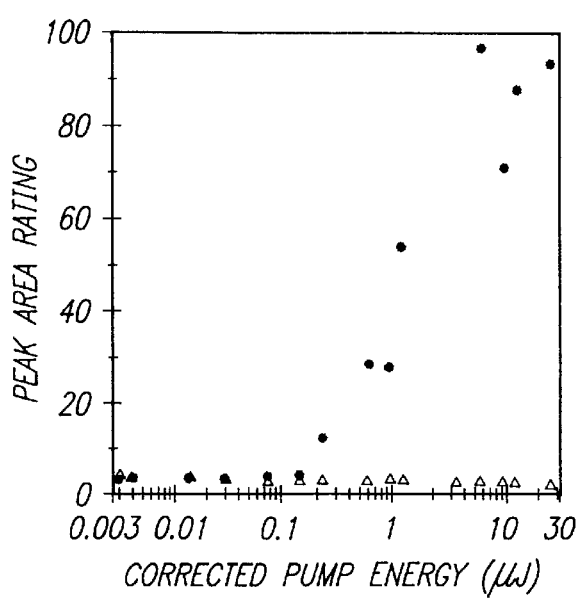
FIG. 11a is a plot of the ratio of integrated intensities (mode ratio) of the 18 552 nm peak to the ~645 nm peak (squares) and of the ~690 nm peak to the ~645 nm peak (triangles) in the system described with reference to FIG. 11.
Figure 11:
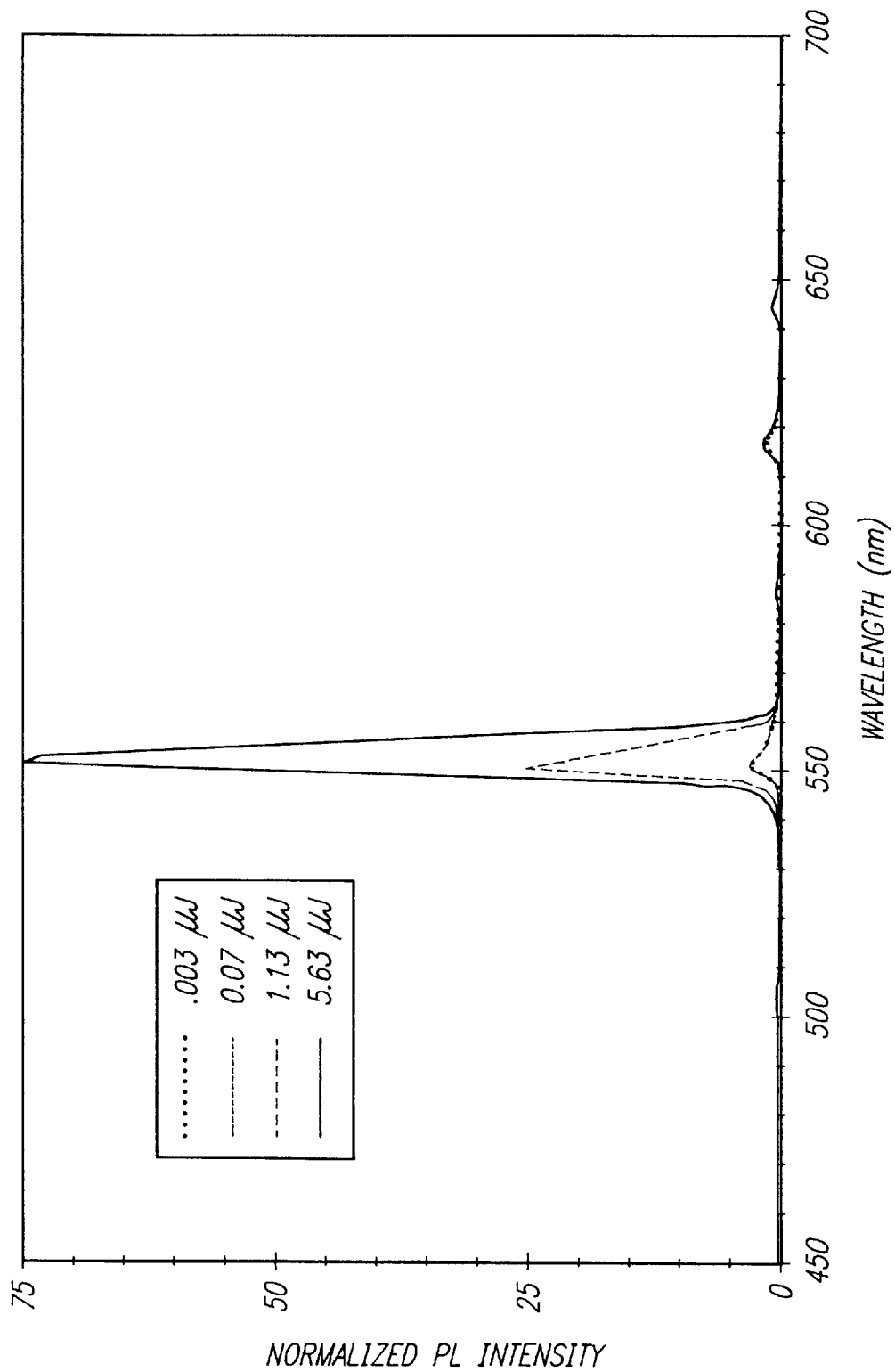
FIG. 11 is a plot of emission spectra from a microcavity: DBR/BuEH-PPV/PVK/Ag at various pump energies. The PVK layer is ~340 nm thick.

The emission modes from a BuEH-PPV microcavity (~340 nm of PVK between the BuEH-PPV and Ag mirror) are shown in FIG. 11. All pump energies were corrected for the transmission of the silver. There was a strong emission peak around 552 nm, close to the gain maximum of BuEG-PPV, and observable emission from four other microcavity modes. An abrupt increase in the mode ratio FIG. 11a was observed near 0.1 µJ/pulse, the lasing threshold. Note that the mode ration approaches 100 at pump energies that are above threshold but still fairly low (~60 µJ/pulse). This demonstrates that microcavities can produce single-mode emission with a narrow peak when pumped above threshold.

Varying the thickness of PVK in microcavities allowed control over the wavelengths of the allowed modes with respect to the gain maximum of BuEH-PPV. We found that the mode ratio is sensitive to the positions of the cavity modes. If the PVK thickness is adjusted such that resonance occurred at the maximum gain wavelength of BuEH-PPV, the normalized mode ratio was greatly enhanced, leading to effectively single-mode emission above threshold (cf. FIG. 11). Single-mode operation was only realized, however, when the lasing peak was located within ~5 nm of the gain maximum. BuEH-PPV microcavities with lasing peak at wavelength less than ~547 nm or greater than ~554 nm showed mode ratios of only about 5, even well above threshold. Hence, to obtain single-mode microcavity lasers, the cavity must be optimized to better than about 5 nm.

By interchanging the order of the polymer layers, one can determine whether there is significant PL quenching of the active polymer by the Ag mirror. Regardless of the presence of PVK or the proximity of the BuEH-PPV to the Ag mirror, the lasing threshold was ground 0.1 µJ/pulse. There was no indication that thresholds were lower for samples with a PVK buffer layer between the BuEH-PPV and Ag. Thus, although the metal electrode limits the Q of the microcavity, PL quenching by proximity to the metal is not of major importance.

Figure 12A:
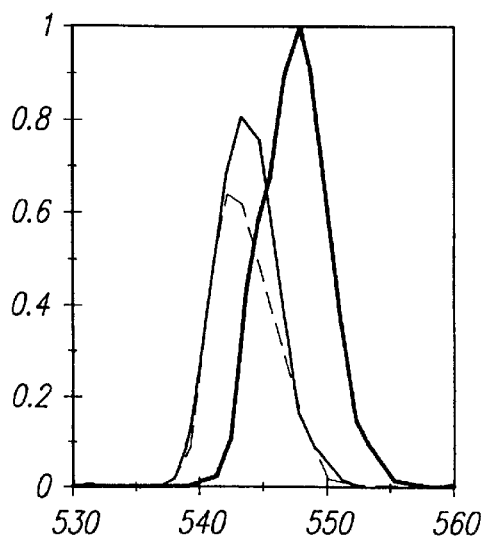
FIG. 12a is an expanded view of the lasing peak near 550 nm of the system described with reference to FIG. 12.
Figure 12:
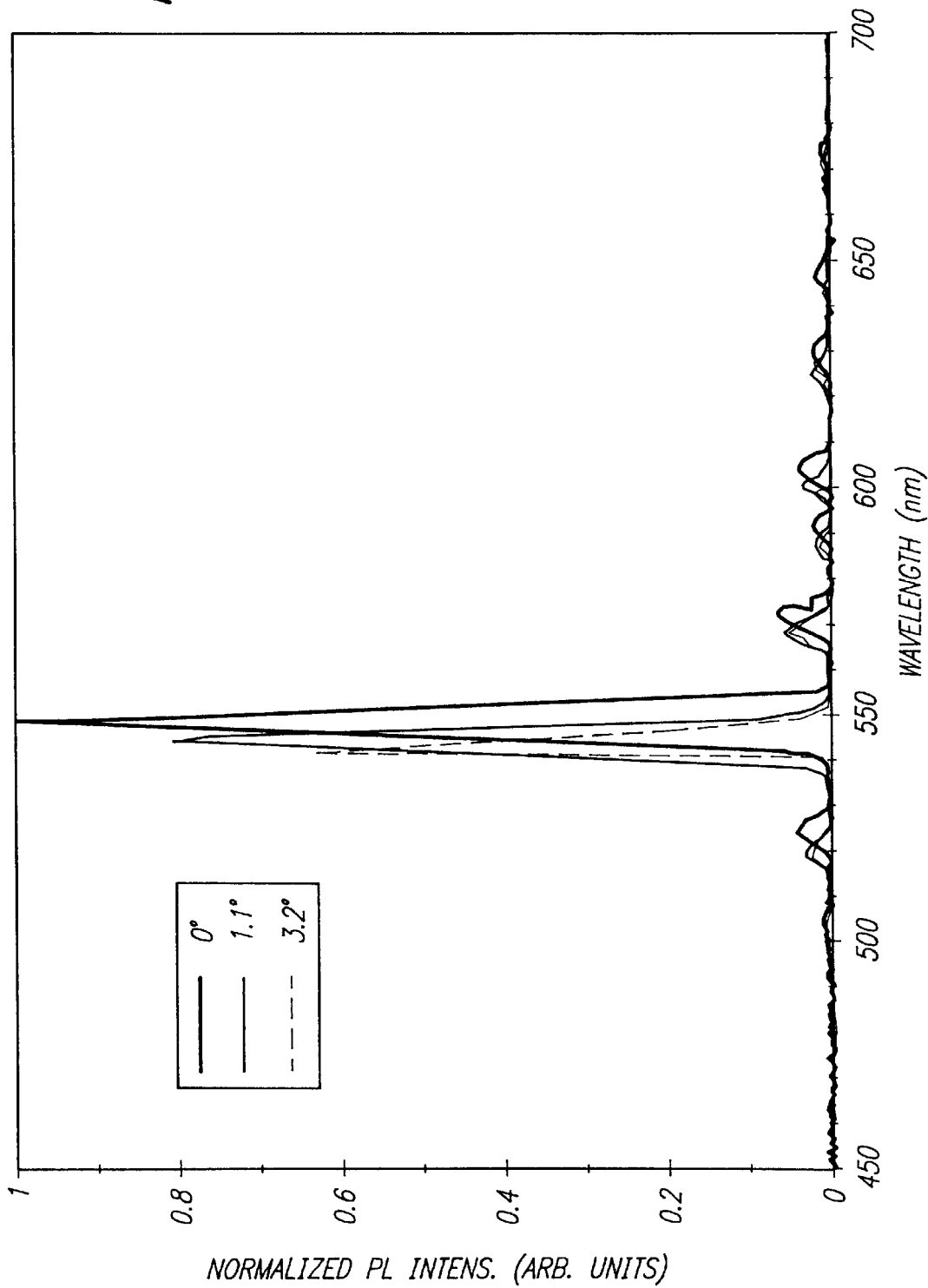
FIG. 12 is a plot of the external observation angle dependence of emission spectra of a microcavity DBR/BuEH-PPV/PVK/Ag at pumping energies above the lasing threshold. PL spectra are normalized to those obtained below threshold. The PVK layer is ~900 nm thick.

The angular dependence of the emission from a microcavity with a ~900 nm PVK layer between BuEH-PPV and Ag is shown in FIG. 12. This structure showed essentially single-mode emission above threshold similar to the data in FIG. 11. To measure the angular dependence, the emitted light was collected through a 1 mm pinhole placed ~10 cm from the sample, providing angular resolution of ~0.5°. At pump energies below the lasing threshold, the integrated emission intensity decreased by nearly an order of magnitude as the collection angle deviated from 0° to 5° from the normal, a result which indicates fairly high Q. The emission spectra shown in FIG. 12 were collected at three different angles at a pump energy (~10 µJ/pulse) well above the lasing threshold (see FIG. 12a). The spectra are scaled such that the intensities of the main peak at below-threshold pumping levels were normalized to the same value so that the directionality that is inherent in microcavity structure has been divided out. FIG. 12 shows that above threshold, the normalized intensity of the main peak was reduced by ~35% relative to its below-threshold value as the collection angle was increased from 0 to 3.2 degrees. Thus, in addition to the relatively high degree of directionality expected for microcavities, the directionality was enhanced above the lasing threshold.

This Example demonstrates that the light emitted from optically pumped semiconducting polymer microcavities is laser light.

What is claimed is:

1. A solid state lasing layer comprising conjugated polymer having a ground state and an excited state and which, in the form of a nondiluted thin film, meets the criteria of:
   i. having a strong absorption in the ground state with an absorption coefficient of at least about $10^4$ cm$^{-1}$ and an absorption depth not greater than about 1 µm,
   ii. having an efficient luminescence emission from the excited state, said emission being shifted to lower energy relative to the ground state absorption, and iii. providing stimulated emission which is not overwhelmed by photoinduced absorption, such that said thin film exhibits gain narrowing and amplified spontaneous emission.

2. The solid state lasing layer of claim 1 wherein the conjugated polymer is a functionalized conjugated polymer.

3. The solid state lasing layer of claim 2 comprising a blend of two or more functionalized conjugated polymers each of which meets the criteria.

4. The solid state lasing layer of claim 2 comprising a copolymer of two or more distinct mer units each corresponding to a functionalized conjugated polymer which satisfies the criteria.

5. The solid state lasing layer of claim 2 comprising a blend of two or more polymers at least one of which is conjugated polymer which satisfies the criteria.

6. The solid state lasing layer of claim 2 comprising a copolymer of two or more distinct mer units at least one corresponding to a conjugated polymer which satisfies the criteria.

7. The solid state lasing layer of claim 2 in the form of a thin film having a thickness of less than 10 microns.

8. The solid state lasing layer of claim 2 in the form of a thin film having a thickness of less than 5 microns.

9. The solid state lasing layer of claim 2 in the form of a thin film having a thickness of less than 1 micron.

10. The solid state lasing layer of claim 7 exhibiting said gain narrowing and amplified spontaneous emission at pump energies per pulse of less than 100 micro-Joules.

11. The solid state lasing layer of claim 7 exhibiting said gain narrowing and amplified spontaneous emission at pump energies per pulse of less than 10 micro-Joules.

12. The solid state lasing layer of claim 7 exhibiting said gain narrowing and amplified spontaneous emission at pump energies per pulse of less than 1 micro-Joule.

13. The solid state lasing layer of claim 2 wherein the functionalized conjugated polymer comprises conjugated repeat units making up a conjugated backbone and at least one nonconjugated moiety extending from the backbone, wherein said at least one nonconjugated moiety provides at least about 5 carbon and/or oxygen atoms for each conjugated repeat unit.

14. The solid state lasing layer of claim 13 wherein the nonconjugated moieties extend from copolymeric units in the polymer which are separate from the conjugated repeat units.

15. The solid state lasing layer of claim 13 wherein the nonconjugated moieties extend from the conjugated repeat units as substituents.

16. The solid state lasing layer of claim 13 wherein the functionalized conjugated polymer is selected from the group consisting of functionalized poly(phenylene), functionalized poly(phenylenevinylene), functionalized poly(fluorene), functionalized poly(p-pyridine), and functionalized poly(p-pyridalvinylene).

17. In a solid state laser having a solid state lasing layer exhibiting gain narrowing and amplified spontaneous emission, the improvement comprising the solid state lasing layer of claim 1.

18. The improved solid state laser of claim 17 as a thin film laser, an optically pumped laser or an injection laser.

19. The improved solid state laser of claim 17 as an optically pumped laser.

20. The improved solid state laser of claim 17 as an injection laser.

21. In a solid state laser having a solid state thin film lasing layer exhibiting gain narrowing and amplified spontaneous emission, the improvement comprising the solid state thin film lasing layer of claim 7.

22. The improved solid state laser of claim 17 additionally comprising mirrors external to the lasing layer, said eternal mirrors providing feedback to the lasing layer.

23. The improved solid state laser of claim 17 wherein the solid state lasing layer is in the form of an optical waveguide.

24. The improved solid state laser of claim 23 wherein the optical waveguide is on a substrate which is patterned to provide feedback through distributed feedback.

25. The improved solid state laser of claim 17 additionally comprising at least one dielectric layer adjacent to said lasing layer said at least one dielectric layer providing gain path extension in the lasing layer through mismatch reflection and waveguiding.

26. The improved solid state laser of claim 17 additionally comprising a microcavity within which the lasing layer is located.

27. The improved solid state laser of claim 17, said laser being a polymer light-emitting diode.

28. The improved solid state laser of claim 17, said laser being a polymer light-emitting electrochemical cell.

* * * * *